US012456674B2

(12) United States Patent
Maldo et al.

(10) Patent No.: US 12,456,674 B2
(45) Date of Patent: Oct. 28, 2025

(54) LEADFRAMELESS ELECTRICALLY ISOLATED POWER SEMICONDUCTOR PACKAGE

(71) Applicant: Littelfuse, Inc., Chicago, IL (US)

(72) Inventors: Tiburcio Maldo, Batangas (PH); Robert Ebido, Cavite (PH); Arnel Deveza, Laguna (PH); Jeff Grozen, Muntinlupa (PH); Roger Cadut, Laguna (PH)

(73) Assignee: Littelfuse, Inc., Rosemont, IL (US)

( * ) Notice: Subject to any disclaimer, the term of this patent is extended or adjusted under 35 U.S.C. 154(b) by 378 days.

(21) Appl. No.: 18/200,853

(22) Filed: May 23, 2023

(65) Prior Publication Data

US 2024/0395692 A1    Nov. 28, 2024

(51) Int. Cl.
*H01L 23/498*    (2006.01)
*H01L 21/48*    (2006.01)
*H01L 21/56*    (2006.01)
*H01L 21/60*    (2006.01)
*H01L 21/67*    (2006.01)
*H01L 23/00*    (2006.01)
(Continued)

(52) U.S. Cl.
CPC ...... *H01L 23/49861* (2013.01); *H01L 21/565* (2013.01); *H01L 23/3735* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/29139* (2013.01); *H01L 2224/32245* (2013.01); *H01L 2224/45124* (2013.01); *H01L 2224/48091* (2013.01); *H01L 2224/48245* (2013.01); *H01L 2224/73265* (2013.01); *H01L 2924/10272* (2013.01)

(58) Field of Classification Search
CPC .......... H01L 23/49562; H01L 23/4334; H01L 23/3735; H01L 23/3107; H01L 23/49861; H01L 23/3121; H01L 21/565; H01L 21/56; H01L 21/4821
See application file for complete search history.

(56) References Cited

U.S. PATENT DOCUMENTS

| | | |
|---|---|---|
| 6,404,065 B1 | 6/2002 | Choi |
| 6,534,343 B2 | 3/2003 | Choi |

(Continued)

FOREIGN PATENT DOCUMENTS

| | | |
|---|---|---|
| JP | 6927437 B1 | 9/2021 |
| KR | 1020210076873 | 6/2021 |

(Continued)

OTHER PUBLICATIONS

Extended European Search Report for European Application No. 24175435.7, dated Oct. 25, 2024, 8 pages.

*Primary Examiner* — Mohsen Ahmadi
(74) *Attorney, Agent, or Firm* — KDW Firm PLLC

(57) ABSTRACT

A lead-free power semiconductor package (PSP) includes a substrate, multiple copper leads, a die, and an encapsulant. The substrate has alternating layers of copper and silicon nitride. The copper leads, which are not part of a leadframe, are connected to the substrate using active metal brazing. The die, which contains circuitry to allow the PSP to operate, is connected to the substrate using silver sintered paste. The encapsulant encases the substrate and the die with a portion of the multiple leads being outside the encapsulant.

16 Claims, 25 Drawing Sheets

(51) Int. Cl.
  *H01L 23/31*  (2006.01)
  *H01L 23/373*  (2006.01)
  *H01L 23/433*  (2006.01)
  *H01L 23/495*  (2006.01)

(56) References Cited

U.S. PATENT DOCUMENTS

| | | | | |
|---|---|---|---|---|
| 7,586,179 B2* | 9/2009 | Calo | ............... | H01L 23/4952 |
| | | | | 257/E23.101 |
| 2001/0044167 A1* | 11/2001 | Kuo | ............... | H01L 24/40 |
| | | | | 257/784 |
| 2003/0160307 A1* | 8/2003 | Gibson | ............... | H01L 23/645 |
| | | | | 257/666 |
| 2009/0091010 A1* | 4/2009 | Calo | ............... | H01L 24/33 |
| | | | | 438/107 |
| 2009/0160595 A1* | 6/2009 | Feng | ............... | H01L 23/49861 |
| | | | | 336/200 |
| 2021/0005544 A1 | 1/2021 | Oohiraki | | |
| 2021/0366799 A1* | 11/2021 | Choi | ............... | H01L 23/13 |
| 2022/0415747 A1 | 12/2022 | Yokoyama | | |
| 2023/0260861 A1* | 8/2023 | Dezsi | ............... | H01L 23/58 |
| | | | | 257/675 |
| 2024/0243031 A1* | 7/2024 | Lin | ............... | H01L 23/5389 |
| 2024/0304507 A1* | 9/2024 | Dezsi | ............... | H01L 23/3107 |

FOREIGN PATENT DOCUMENTS

| | | | |
|---|---|---|---|
| KR | 1020220120444 A | 8/2022 | |
| TW | 202200527 A | 1/2022 | |
| WO | 0007238 A1 | 2/2000 | |
| WO | 2021133419 A1 | 7/2021 | |

* cited by examiner

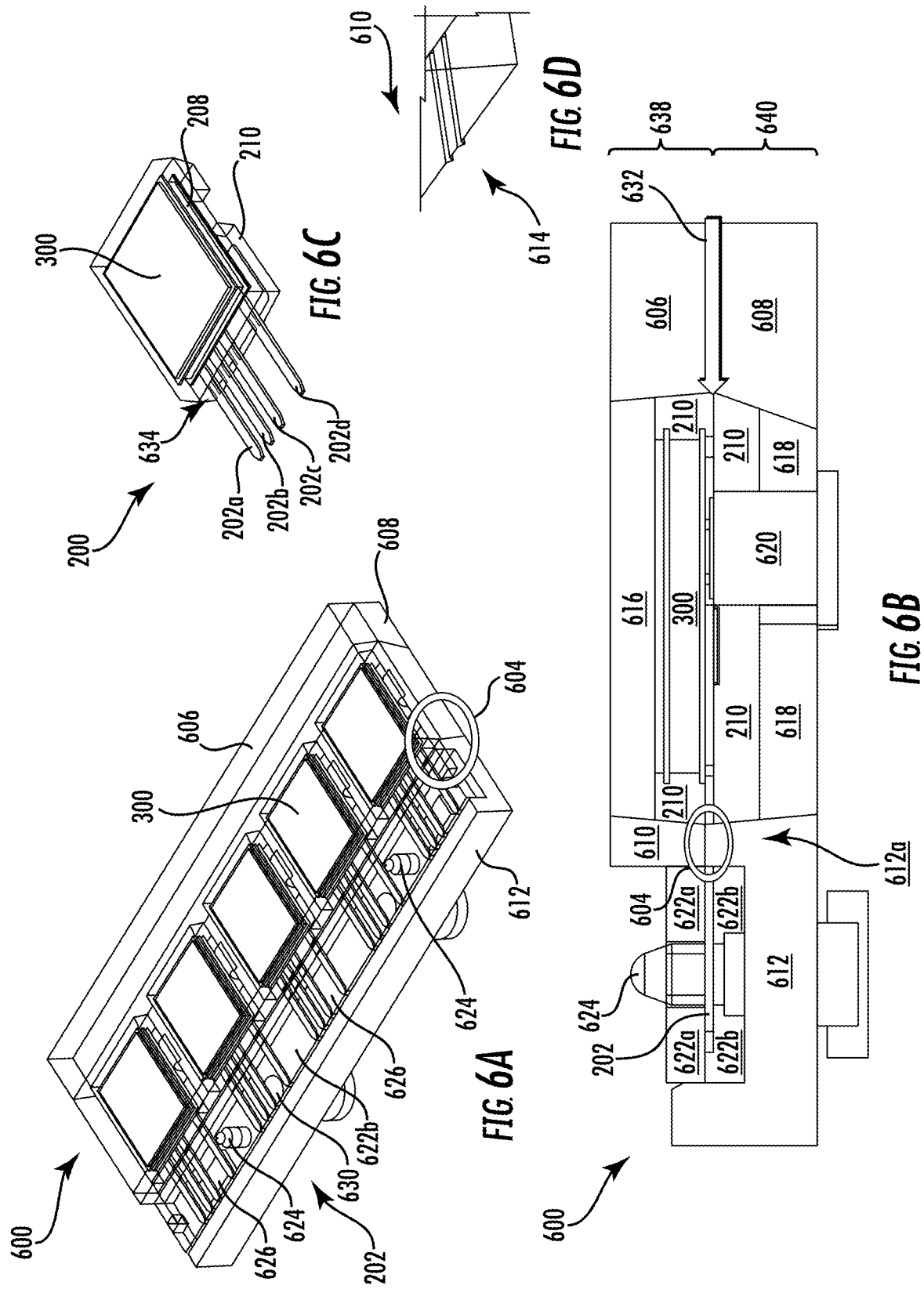

| PRIOR ART | DISCLOSED ART | ADVANTAGE |
|---|---|---|
| WITH LEADFRAME | NON LEADFRAME | REDUCED MANUFACTURING & PACKAGING COST |
| USES STD SUBSTRATE Al2O3 OR AlN DCB | HIGH-PERFORMANCE SUBSTRATE: AMD Si3N4 | HIGH CURRENT CARRYING CAPABILITY<br>NO CERAMIC CRACK ISSUE DUE TO HIGH BENDING STRENGTH AND TOUGHNESS.<br>BETTER WIREBONDABILITY DUE TO SMALLER GRAIN STRUCTURE |
| SOLDERED POWER TERMINAL INTO THE SUBSTRATE | NO SOLDER CONNECTION. | HIGH RELIABILITY PERFORMANCE DUE TO THE ABSENCE OF SOLDER. |
| HIGHER DCB WARPAGE | MINIMAL DCB WARPAGE | BETTER THERMAL PERFORMANCE (LOWER Rthjc) |
| SOLDERED DIE | Ag SINTERED DIE | HIGHER OPERATING TEMPERATURE<br>LEAD FREE, SOLDER VOIDS FREE, HIGHER RELIABILITY PERFORMANCE. |

FIG. 10A

| PROPERTY | Al₂O₃ | AlN | H_AlN | ZTA | Si₃N₄ |
|---|---|---|---|---|---|
| PROCESS COMPATIBILITY | DCB | DCB AMB | DCB AMB | DCB | AMB |
| FLEXURAL STRENGTH (MPa, 3POINT) | >550 | >450 | >580 | >700 | >800 |
| THERMAL CONDUCTIVITY (W/mK) | >25 | >170 | >150 | >25 | >80 |
| THERMAL EXPANSION COEFFICIENT (ppm/K) | 7 | 4.5 | 4.5 | 8 | 2.5 |
| MICROSTRUCTURE | | | | | |

|  | $Al_2O_3$ 96% | AlN | ZTA (9%) | $Si_3N_4$ |
|---|---|---|---|---|
| THERMAL CONDUCTIVITY [W/mK] | 24 | 180 | 28 | 90 |
| BENDING STRENGTH [MPa] | 450 | 300 | 700 | 650 |
| FRACTURE TOUGHNESS [MPa/√m] | 3,8-4,2 | 3-3,4 | 4,5-5 | 6,5-7 |

FIG. 10C

LEADFRAMELESS ELECTRICALLY ISOLATED POWER SEMICONDUCTOR PACKAGE

FIELD OF THE DISCLOSURE

Embodiments of the present disclosure relate to power semiconductor packages (PSPs) and, more particularly, with issues associated with the substrate and leads of PSPs.

BACKGROUND

In discrete semiconductor manufacturing, it is common to have the so-called backbone of a semiconductor package being a leadframe. The main purposes of the leadframe are to carry the electrical signal from a chip to the outside world and to absorb heat generated by the chip.

For power semiconductor packages (PSPs), the leadframe consists of a unitary copper structure consisting of a defined number of leads (legs) coupled into a dambar, with the dambar being orthogonal to the leads. In common cases, the leadframe will include a die attach paddle (DAP), for attaching the die. When the PSP is encapsulated, such as with an epoxy molding compound (EMC), the leads would remain partially outside the encapsulant while the DAP and die are inside the encapsulant.

The introduction of DBC/DCB (Direct Copper Bonding) substrates into the isolated family of semiconductor packages are advantageous for some applications. With DCB substrates, the heat is dissipated into the substrate instead of the DAP. Thus, the DAP part of the leadframe is unnecessary with DCB substrates and the extra cost of the copper DAP portion of the leadframe could be eliminated. Nevertheless, the leads are still required for electrical connections from the die to outside the PSP. Traditionally, the dambar of the leadframe has provided a critical element in the manufacture of the PSP.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a lead-free power semiconductor package (PSP) in accordance with the present disclosure may include a substrate, multiple copper leads, a die, and an encapsulant. The substrate has alternating layers of copper and ceramic made of silicon nitride. The copper leads, which are not part of a leadframe, are connected to the substrate using active metal brazing. The die, which contains circuitry to allow the PSP to operate, is connected to the substrate using silver sintered paste. The encapsulant encases the substrate and the die with a portion of the multiple leads being outside the encapsulant.

Another exemplary embodiment of a transfer mold used in the manufacture of a PSP in accordance with the present disclosure may include a top leadguide block and a bottom leadguide block, a top cavity and a bottom cavity, and a pinchbar. The top and bottom leadguide blocks surround leads that are part of a substrate assembly of the PSP, the substrate assembly having multiple leads that are not part of a leadframe, a substrate, and a die. The top and bottom cavities are adjacent to the top and bottom leadguides, respectively, with the substrate of the substrate assembly fitting therein. The pinchbar is disposed between the top leadguide block and the bottom leadguide block and prevents bleeding of an encapsulant into a cavity formed by mating the top cavity and the bottom cavity.

An exemplary embodiment of a method for manufacturing a PSP using a transfer mold in accordance with the present disclosure may include inserting multiple substrate assemblies into an aluminum boat. The multiple substrate assemblies each include leads, a substrate, and a die. The aluminum boat is depressed in a first plane on a first side, where the depression forms a cavity for receiving substrate of the multiple substrate assemblies. The aluminum boat is also elevated in a second plane on a second side adjacent the first side, where leads of the multiple substrate assemblies are received into the second side. The method also includes adding a carrier plate to the aluminum boat so that the carrier plate is located over the leads, the carrier plate having one or more magnets to affix the carrier plate to the leads. The method also includes fitting the substrate assemblies into a bottom chase of a transfer mold, the bottom chase having a bottom leadguide block including one or more pinchbar crevices.

BRIEF DESCRIPTION OF THE DRAWINGS

FIGS. 6A-6G are diagrams illustrating tools used for transfer molding assembly of the power semiconductor package of FIGS. 2A-2F, in accordance with exemplary embodiments;

FIGS. 10A-10E are diagrams illustrating empirical data in support of using the power semiconductor package of FIGS. 2A-2F over prior art power semiconductor substrates, in accordance with exemplary embodiments.

DETAILED DESCRIPTION

A power semiconductor package (PSP) is disclosed herein. The PSP is a lead-free implementation, using leads that are not part of a leadframe. The substrate includes a novel arrangement of copper and silicon nitride layers, with the middle copper layer being particularly thick to prevent warpage. The substrate is active metal brazed and lead-free die attach material, such as silver sintered paste is used. A novel transfer mold is also disclosed to facilitate manufacture of the lead-free PSP. The transfer mold features a pinchbar to prevent bleeding of encapsulant outside a desired area during manufacturing, a feature made necessary because no leadframe is used (and thus no dambar is available). The transfer mold also features a support bar to stabilize the substrate during manufacture as well as magnetic blocks to attach to the leads during assembly. The assembly process utilizes these features of the transfer mold to manufacture the PSPs. The result is a lower-cost solution (no leadframe, no soldering) with better characteristics (improved system reliability, more current carrying capability, warpage control, less ceramic cracking) over legacy PSPs.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components, each with respect to the geometry and orientation of other features and components appearing in the perspective, exploded perspective, and cross-sectional views provided herein. Said terminology is not intended to be limiting and includes the words specifically mentioned, derivatives therein, and words of similar import.

Figure 1A:
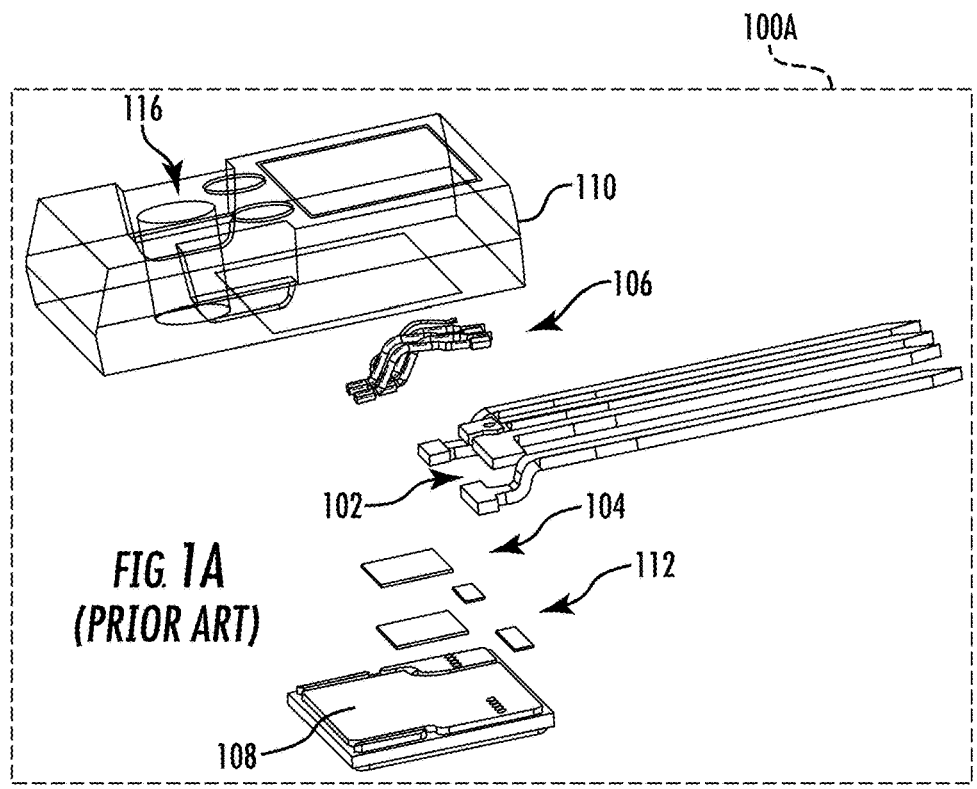
FIGS. 1A-1F are diagrams illustrating two power semiconductor packages with leadframes, in accordance with the prior art.
Figure 1B:
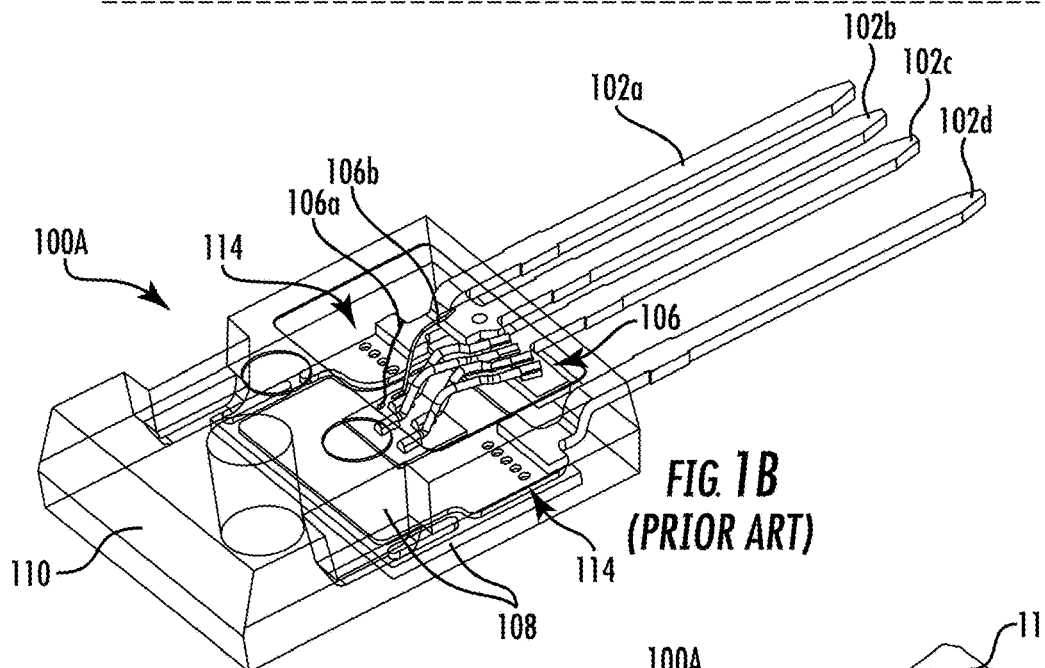
Figure 1C:
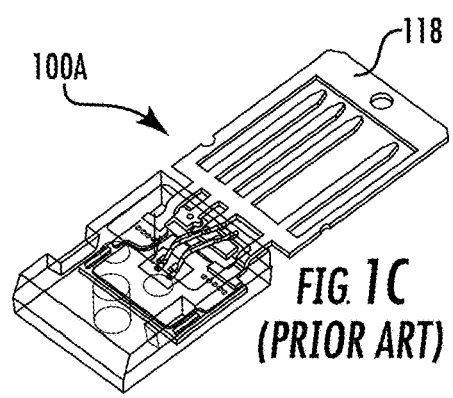
Figure 1D:
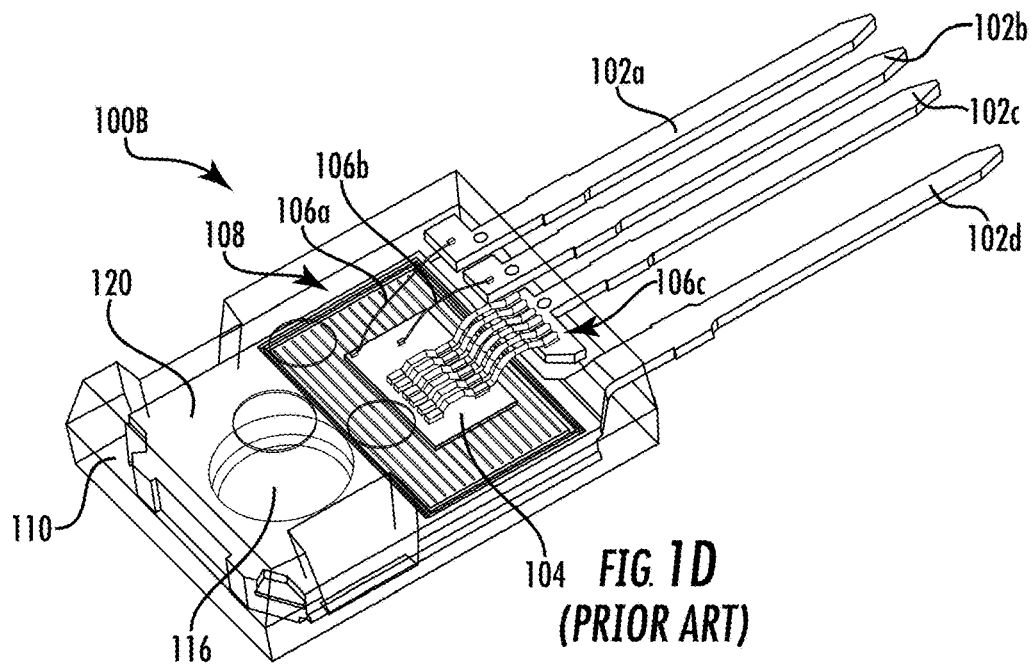
Figure 1E:
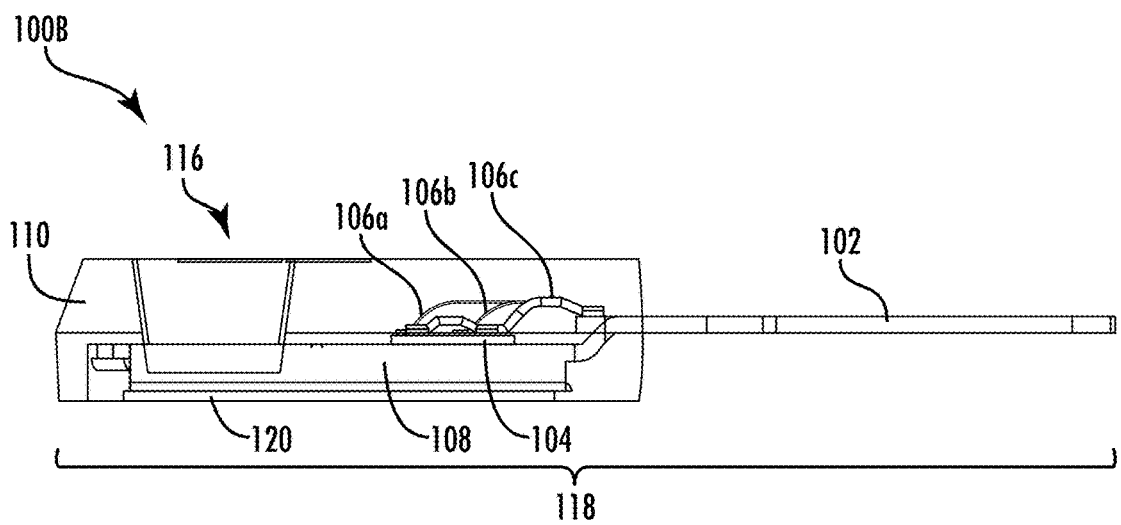
Figure 1F:
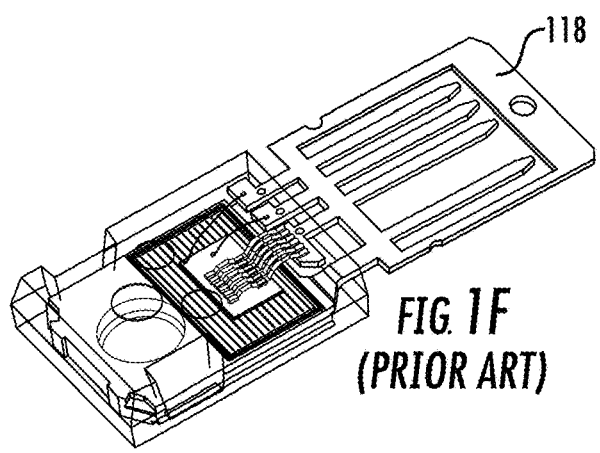

FIGS. 1A-1F are representative drawings of a power semiconductor package (PSP) with leads that are part of a leadframe, according to the prior art. FIG. 1A is an exploded view and FIGS. 1B-1C are isometric views of a first embodiment of an electrically isolated power semiconductor package, PSP 100A; and FIGS. 1D and 1F are isometric views and FIG. 1E is a side view of a second embodiment of an electrically non-isolated power semiconductor package, PSP 100B (collectively, "PSP(s) 100"). The PSPs 100 are examples of a thruhole Iso247 package having four leads, although the number of leads may vary.

The PSPs 100 each include leads 102a-d (collectively, "lead(s) 102"), a die 104, interconnection wires 106a-c (collectively, "interconnection wire(s) 106"), with interconnection wires 106c actually being a bundle of wires, a direct copper bonding (DCB) substrate 108, and an encapsulant 110. The die 104 and two of the leads, 102a and 102d, are attached to the DCB substrate 108 using solder 112. The interconnection wire 106a attaches the die 104 to lead 102a, interconnection wire 106b attaches the die 104 to lead 102b, and the bundle of interconnection wires 106c attach between the die 104 and the lead 102c. Solder stopper holes 114 help to control the placement of the solder 112. All elements of the PSPs 100, including part of the leads 102, are enclosed in the encapsulant 110. The PSPs 100 include mounting holes 116 for attaching to a heatsink, although they may alternatively be attached to a heatsink by alternative means, such as metal clip for non-hole type of PSPs.

The leads 102 are part of a leadframe 118. In the PSP 100A, the leadframe (FIG. 1C) surrounds the leads 102, with the leads extending past the rectangular portion of the leadframe to connect to the substrate 108 and die 104. In the PSP 100B, the leadframe 118 (FIGS. 1D-1F) include an interior portion known as a die attach paddle (DAP) 120, which is disposed below the DCB substrate 108.

The PSPs 100 are a type of silicon carbide (SiC) technology, with the DCB substrate 108 being aluminum oxide ($Al_2O_3$), the solder 112 being used between the die 104 and the substrate 108 being high lead (Pb), and the solder being used between the substrate and the leadframe 118 also being high Pb. The interconnection wires 106 are made of aluminum, and the encapsulant 110 is an epoxy molding compound (EMC).

Figure 2A:
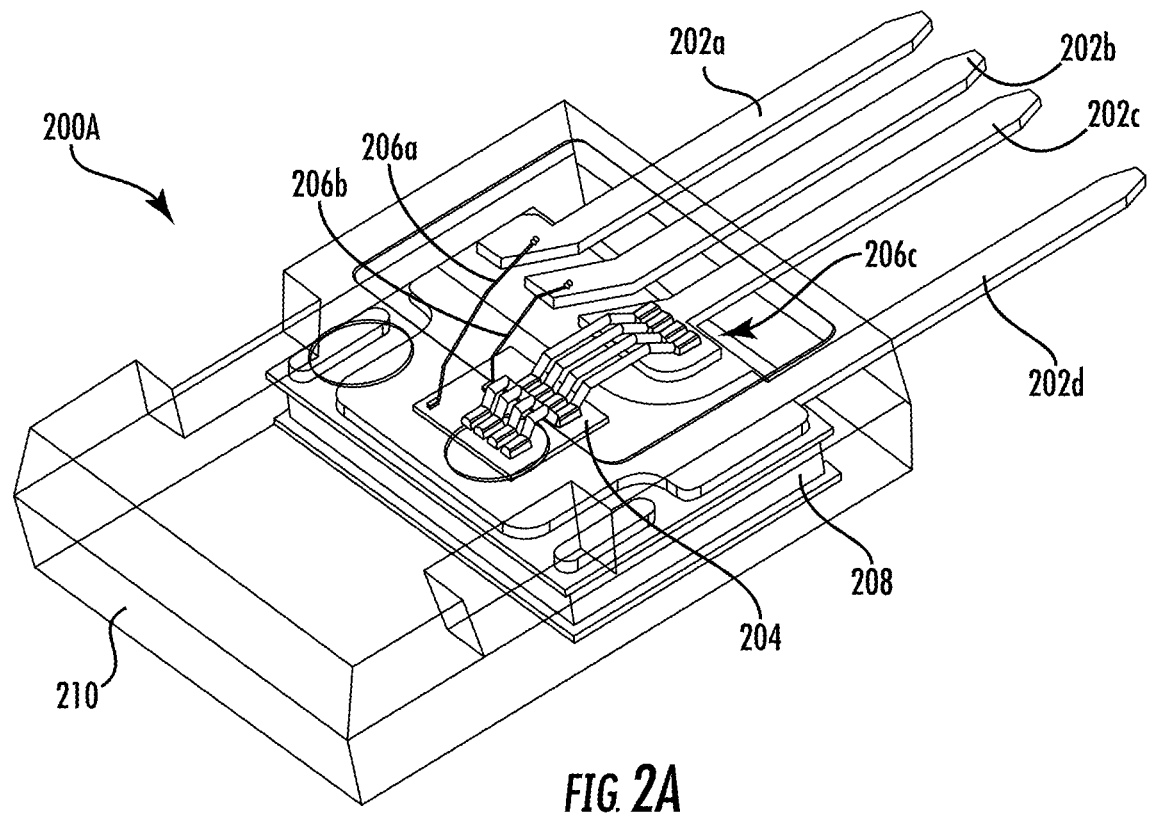
FIGS. 2A-2F are diagrams illustrating a power semiconductor package with leadframeless leads, in accordance with exemplary embodiments.
Figure 2B:
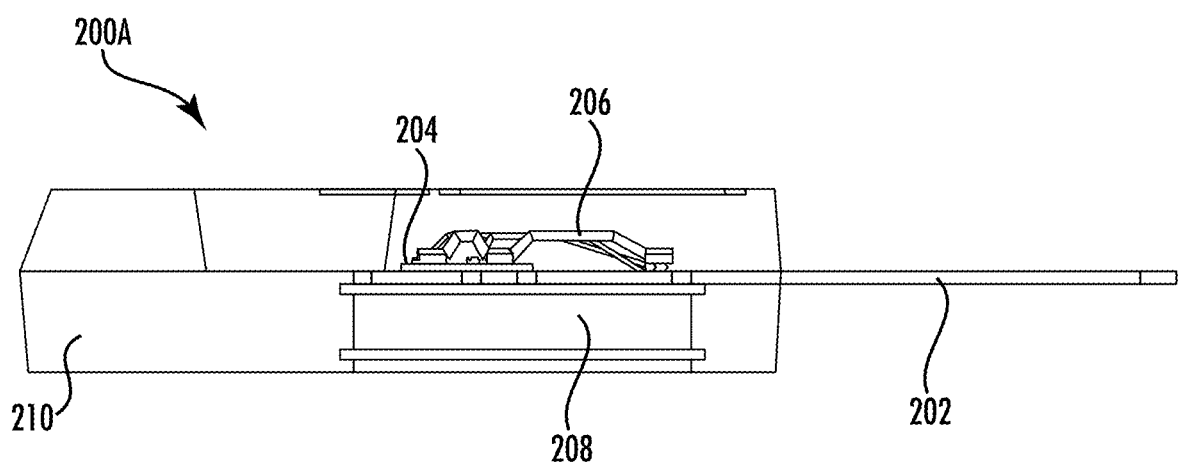
Figure 2C:
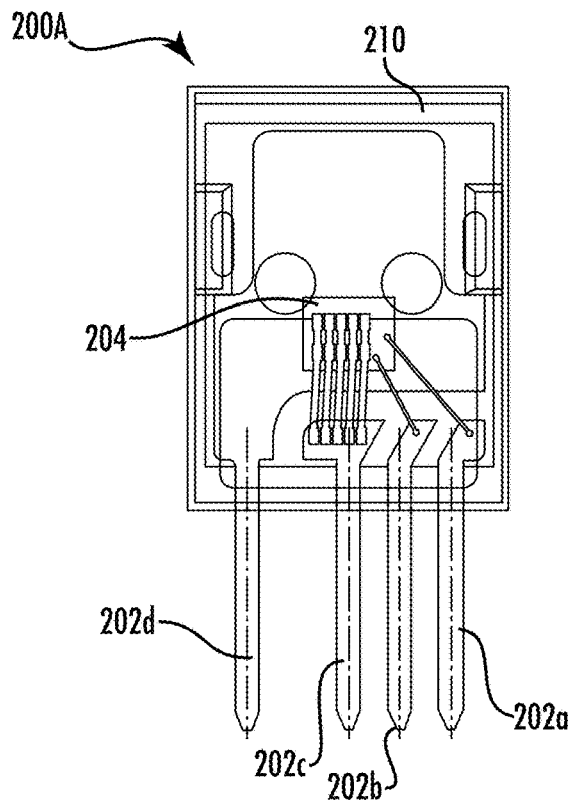
Figure 2D:
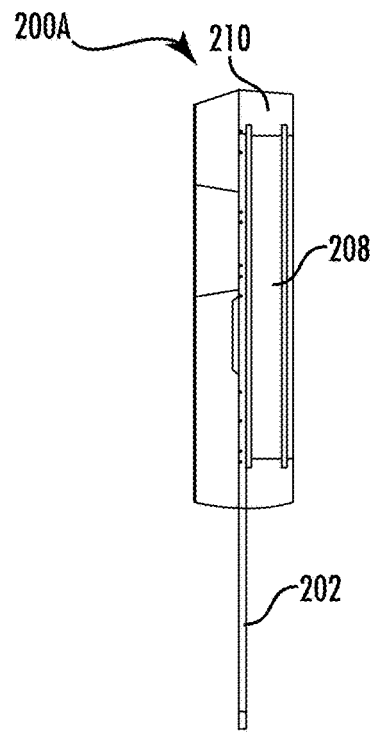
Figure 2E:
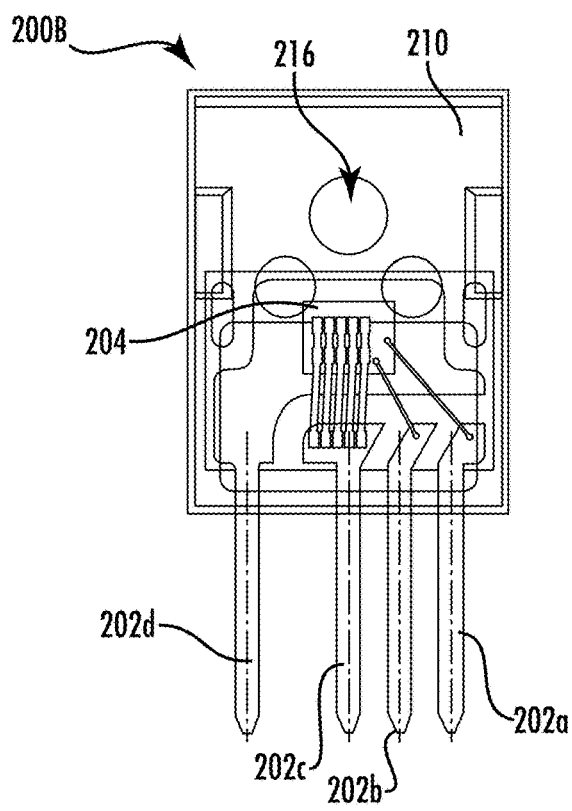
Figure 2F:
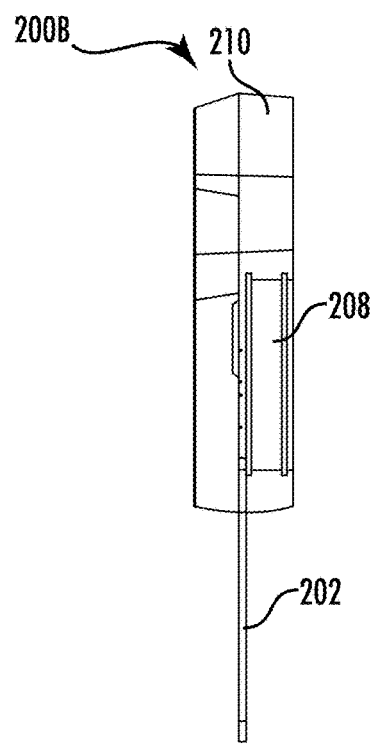

FIGS. 2A-2F are representative drawings of a PSP without a leadframe, according to exemplary embodiments. Two embodiments are shown, PSP 200A, which has no heatsink mounting hole, and PSP 200B, which includes a heatsink mounting hole (collectively, "PSP(s) 200"). FIG. 2A is an isometric view, FIG. 2B is a side view, FIG. 2C is an overhead view, and FIG. 2D is a second side view of PSP 200A, and FIG. 2E is an isometric view and FIG. 2F is a side view of PSP 200B. The PSPs 200 are examples of a thruhole Iso247 package having four leads, although the number of leads may vary.

The PSPs 200 each include leads 202a-d (collectively, "lead(s) 202"), a die 204, interconnection wires 206a-c (collectively, "interconnection wire(s) 206"), with interconnection wires 206c actually being a bundle of wires, an active metal brazed (AMB) substrate 208, and an encapsulant 210. The die 204 contains circuitry for operation of the PSP 200, where the operation of the PSP may vary. As with the PSP 100, the die 204 of the PSP 200 is silicon carbide (SiC).

In exemplary embodiments, the die 204 is attached to the AMB substrate 208 using silver (Ag) sintering. The adhesive between the die 204 and the AMB substrate 208 is also Ag sintering. The interconnection wire 206a attaches the die 204 to lead 202a, interconnection wire 206b attaches the die 204 to lead 202b, and the bundle of interconnection wires 206c attach the die 204 to the lead 202c. All elements of the PSPs 200, including part of the leads 202, are enclosed in the encapsulant 210. The PSP 200B includes a mounting hole 216 for attaching to a heatsink and the PSP 200A includes no mounting hole, allowing for alternative attachment to a heatsink.

In exemplary embodiments and in contrast to the prior art PSPs 100, the leads 202 of PSPs 200 are not part of a leadframe. Thus, there is no leadframe portion (die attach paddle) disposed beneath the AMB substrate 208.

Figure 3A:
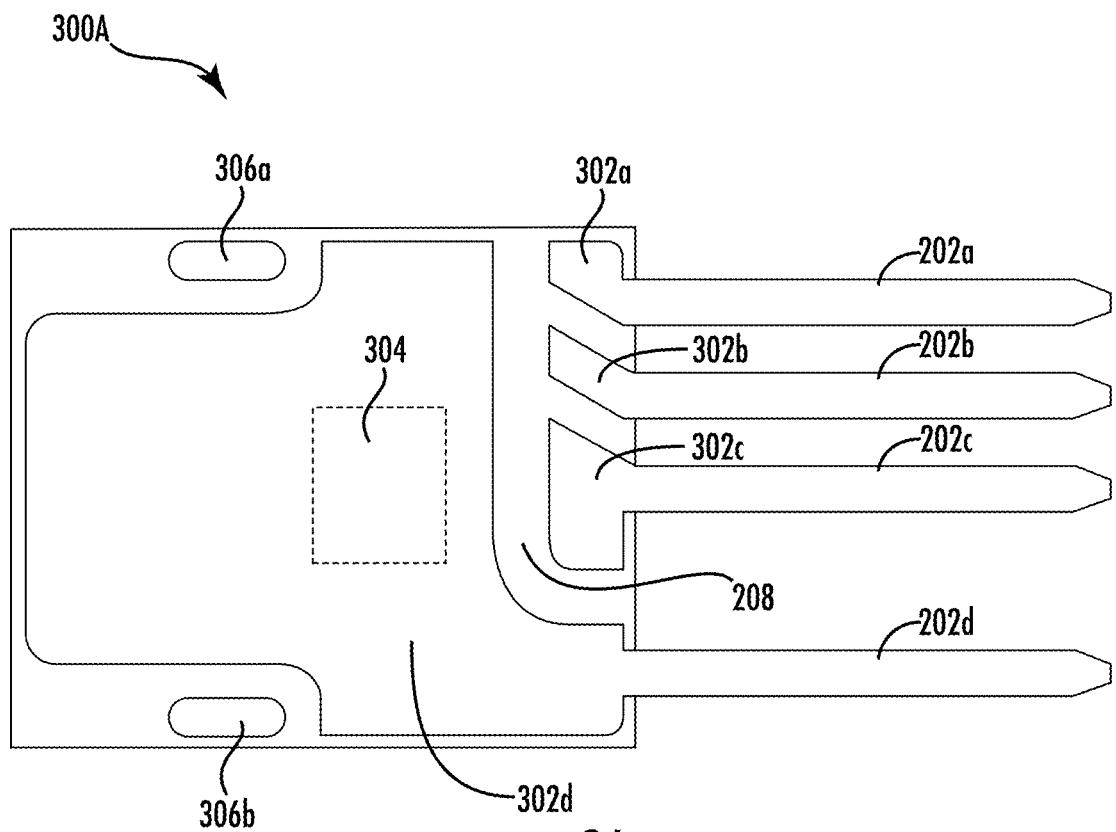
FIGS. 3A-3D are diagrams illustrating an active metal brazed substrate with leadframeless copper leads of the power semiconductor package of FIGS. 2A-2F, in accordance with exemplary embodiments.
Figure 3B:
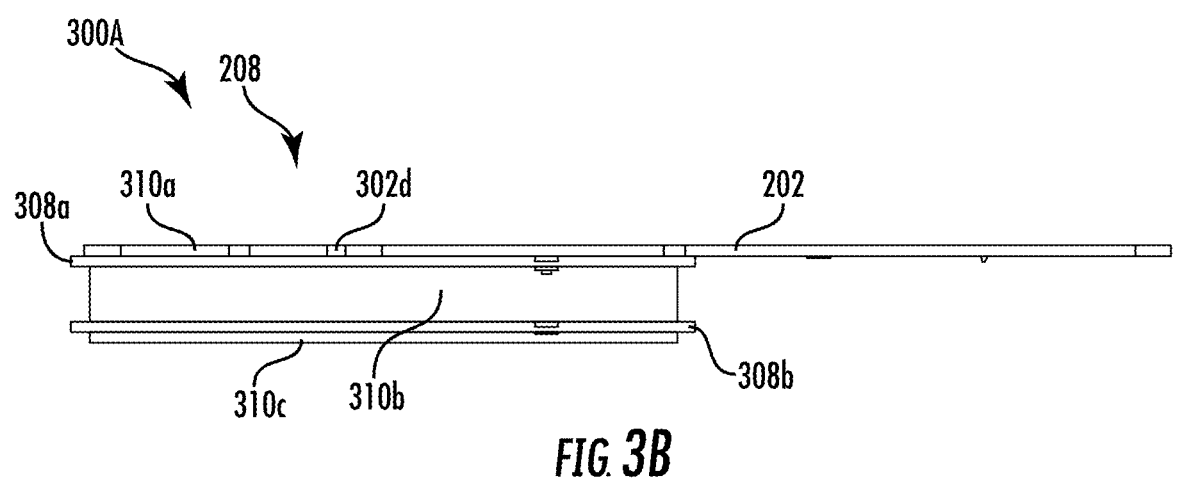
Figure 3C:
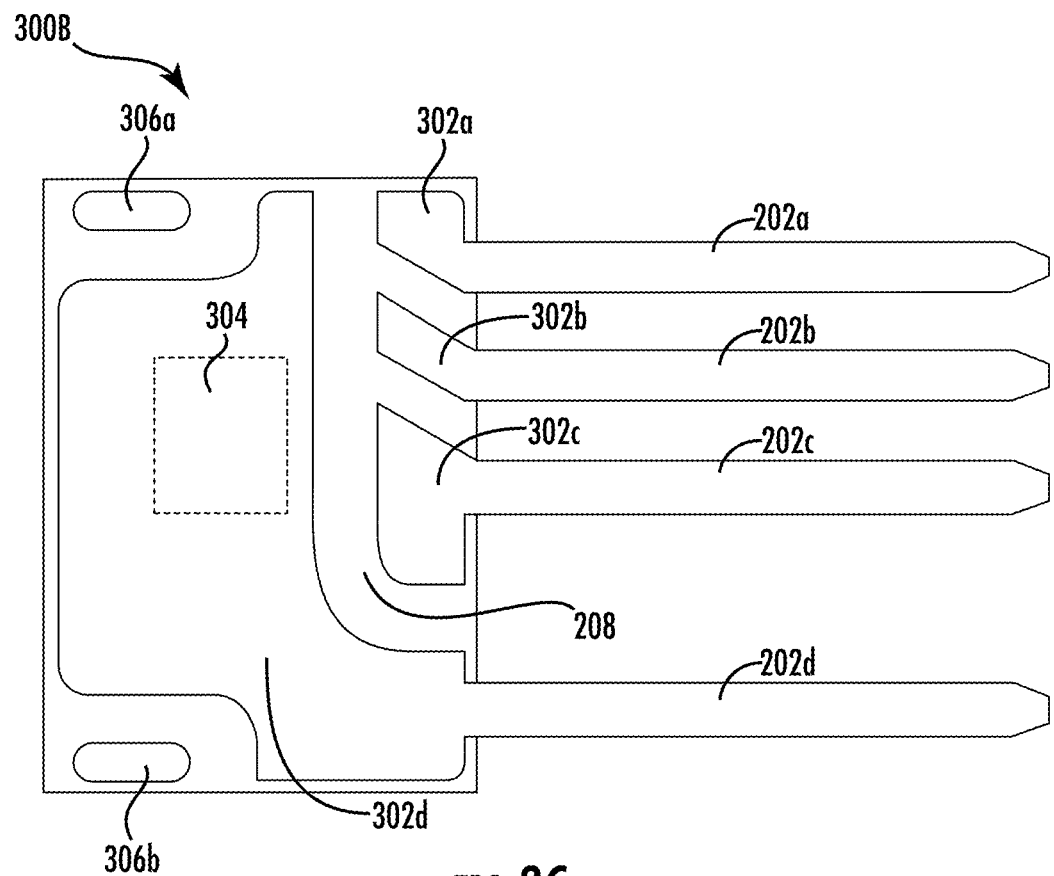
Figure 3D:
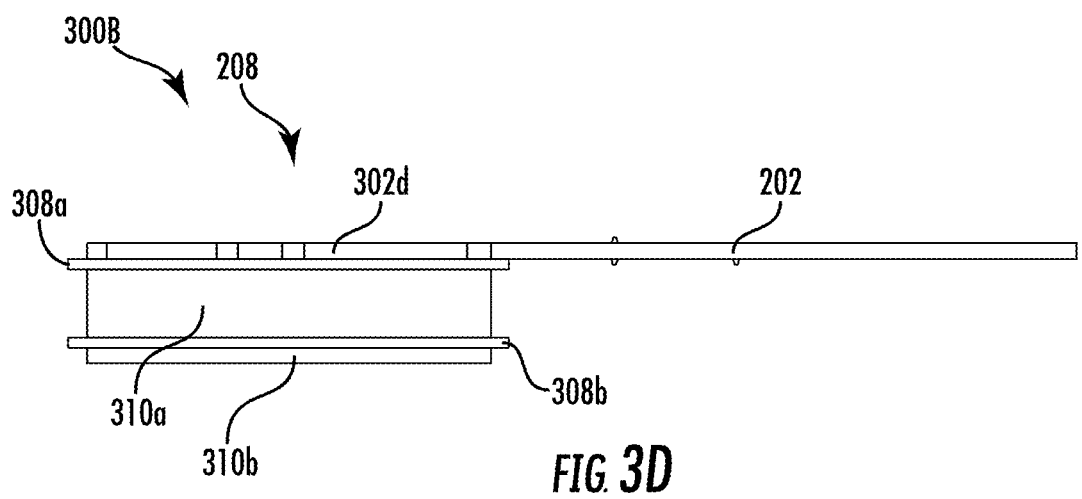

FIGS. 3A-3D are representative drawings of a substrate assembly 300, according to exemplary embodiments. FIG. 3A is an overhead view and FIG. 3B is a side view of a first substrate assembly 300A (for PSP 200A), and FIG. 3C is an overhead view and FIG. 3D is a side view of a second substrate assembly 300B (for PSP 200B) (collectively, "substrate assembly 300" or "substrate assemblies 300"). The substrate assembly 300 is part of the PSP 200 and consists of the substrate 208, the copper leads 202, lead extensions 302, and copper islands 306.

The substrate assembly 300 features lead extensions 302a-d (collectively, "lead extension(s) 302"), which are disposed over the AMB substrate 208. In exemplary embodiments, the lead extensions 302 are copper material unitary with and extending from respective leads. Lead extension 302a is part of lead 202a, lead extension 302b is part of lead 202b, lead extension 302c is part of lead 202c, and lead extension 302d is part of lead 202d. The lead extensions 302 may vary in shape and size other than is illustrated, with the lead extension 302d being significantly larger than lead extensions 302a-c, in some embodiments. A die location 304 is shown in FIGS. 3A and 3C, which shows that the die 204 will be disposed on the lead extension 302d, thus connecting the die to the lead 202d.

In exemplary embodiments, the AMB substrate 208 of the PSP 200 consists of alternating layers of copper and silicon nitride ($Si_3N_4$). The interconnection wires 106 are made of aluminum, and the encapsulant 110 is an epoxy molding compound (EMC).

In exemplary embodiments, the AMB substrate 208 consists of five separate layers, with a top copper layer 310a, a first (ceramic) silicon nitride ($Si_3N_4$) layer 308a, a second copper layer 310b (the middle layer), a second (ceramic) silicon nitride layer 308b, and a third copper layer 310c (collectively, "copper layer(s) 310" and silicon nitride layer(s) 308" or "ceramic layer(s) 308"). As illustrated in FIG. 3B, the ceramic layers 308 are sandwiched between copper layers 310, with ceramic layer 308a being adjacent the top copper layer 310a and the middle copper layer 310b and ceramic layer 308b being adjacent the middle copper layer 310b and the bottom copper layer 310c. In exemplary embodiments, the lead extension 302d is the top copper layer 310a.

In exemplary embodiments, the middle copper layer 310b is thicker than the outside copper layers 310a and 310c. The top, middle, and bottom copper layers 310 may use the same copper that is used in legacy leadframes. In exemplary embodiments, the copper layers 310 are attached to the ceramic layers 308 through an active metal brazing process, and, in some embodiments, are formed of known materials, including silver (Ag), copper (Cu), titanium (Ti), tungsten (W), and combinations thereof, as well as other components.

In some embodiments, the middle copper layer 310b is 1.5 mm, the outside copper layers 310a and 310c are 0.4 mm, and the ceramic layers 308 are 0.25 mm in thickness, for a total stacked up thickness of 2.8 mm for the AMB substrate 208. In exemplary embodiments, the top and bottom copper layer 310a and 310c thicknesses can vary from 0.4 mm to 0.8 mm, depending on the current carrying requirement of the PSP product. In exemplary embodiments, the three copper layers 310 of the PSP 200 can vary in thickness, depending on current carrying requirement, total stackup thickness of the package with respect to isolation distance requirements, and other factors. In exemplary embodiments, using the silicon nitride in the ceramic layers 308 makes the AMB substrate 208 a high-performance substrate with almost four times the improvement in thermal conductivity over legacy substrates.

In exemplary embodiments, the sandwiched arrangement of alternating copper layers 310, with the AMB substrate 208 having a stacked-up thickness of 2.80 mm (with 0.4 mm thickness for the copper layers 310a and 310c) compensates the isolation distance of 2.40 mm from a standard JEDEC package like TO247 and TO220 as examples. In exemplary embodiments, the thick middle copper layer 310b provides warpage prevention control to achieve a desired flatness of the PSP 200 packages.

The substrate assembly 300A differs in size from the substrate assembly 300B, with the substrate assembly 300A having a larger AMB substrate 208 and a larger lead extension 302d than for the substrate assembly 300B. The substrate assembly 300A may thus be part of a PSP with no mounting hole, such as PSP 200A while the substrate assembly 300B may be used in a PSP with a mounting hole, such as PSP 200B.

In exemplary embodiments, the substrate assembly 300 features a pair of copper islands 306a and 306b (collectively, "copper island(s) 306"), disposed over the AMB substrate 208 and on either side of lead extension 302d. The copper islands 306 facilitate alignment with a transfer mold during transfer mold assembly operations. The copper islands 306 are describe in more detail in conjunction with the illustration of FIG. 7, below.

In exemplary embodiments, the lead pitch (distance between leads 202) is equal to a standard PCB hole layout in the market while lead length can be varied based on supplier capability, but not limited to a minimum length of 11.0 mm. For both the substrates 300A and 300B, the length and width (L×W) dimensions are the same as for legacy PSPs, for full flexibility from existing TO247 package bodies, with or without mounting holes for external heatsink mounting.

Figure 4A:
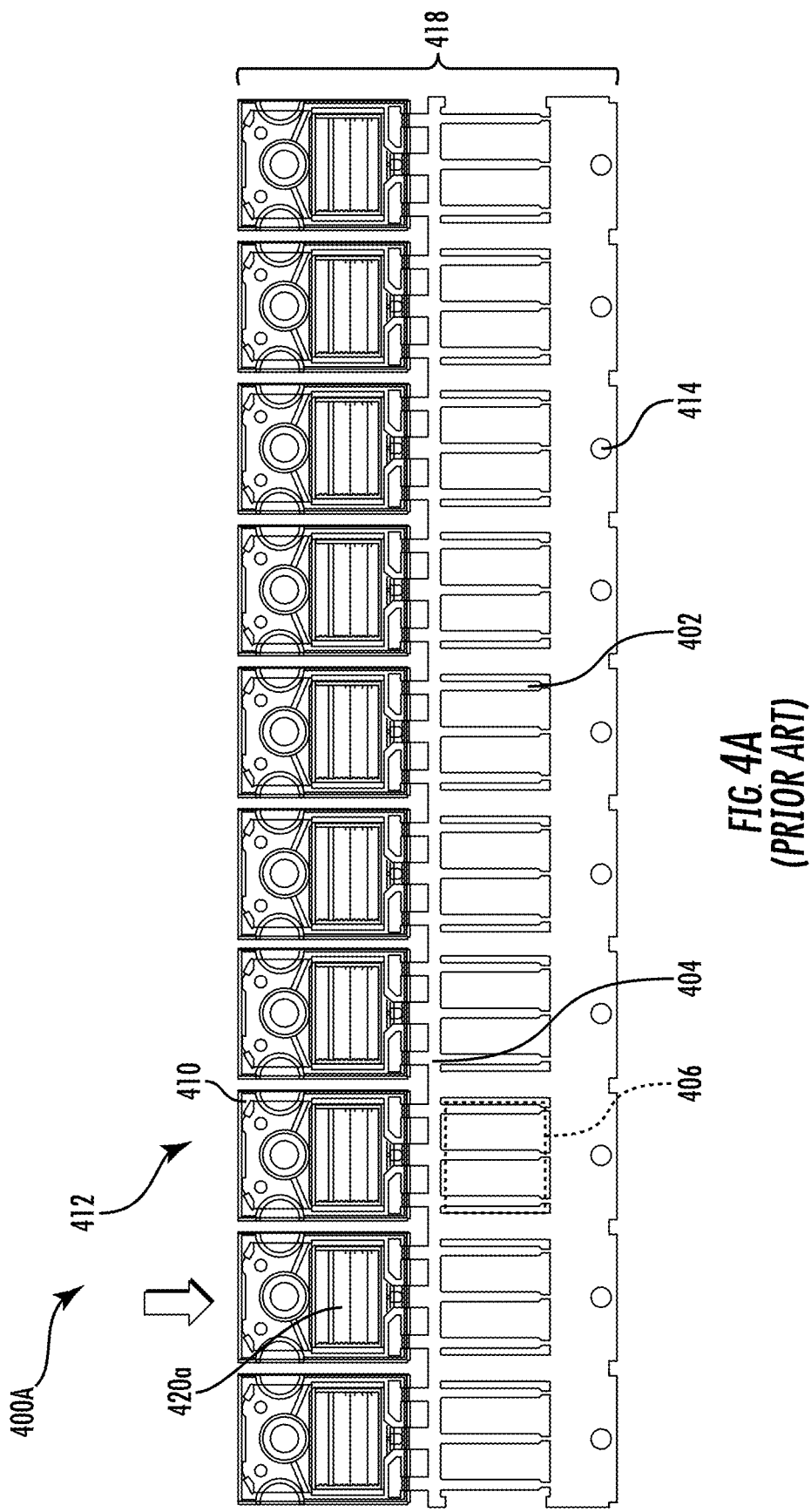
FIGS. 4A-4C are diagrams illustrating a leadframe assembly, in accordance with the prior art.
Figure 4B:
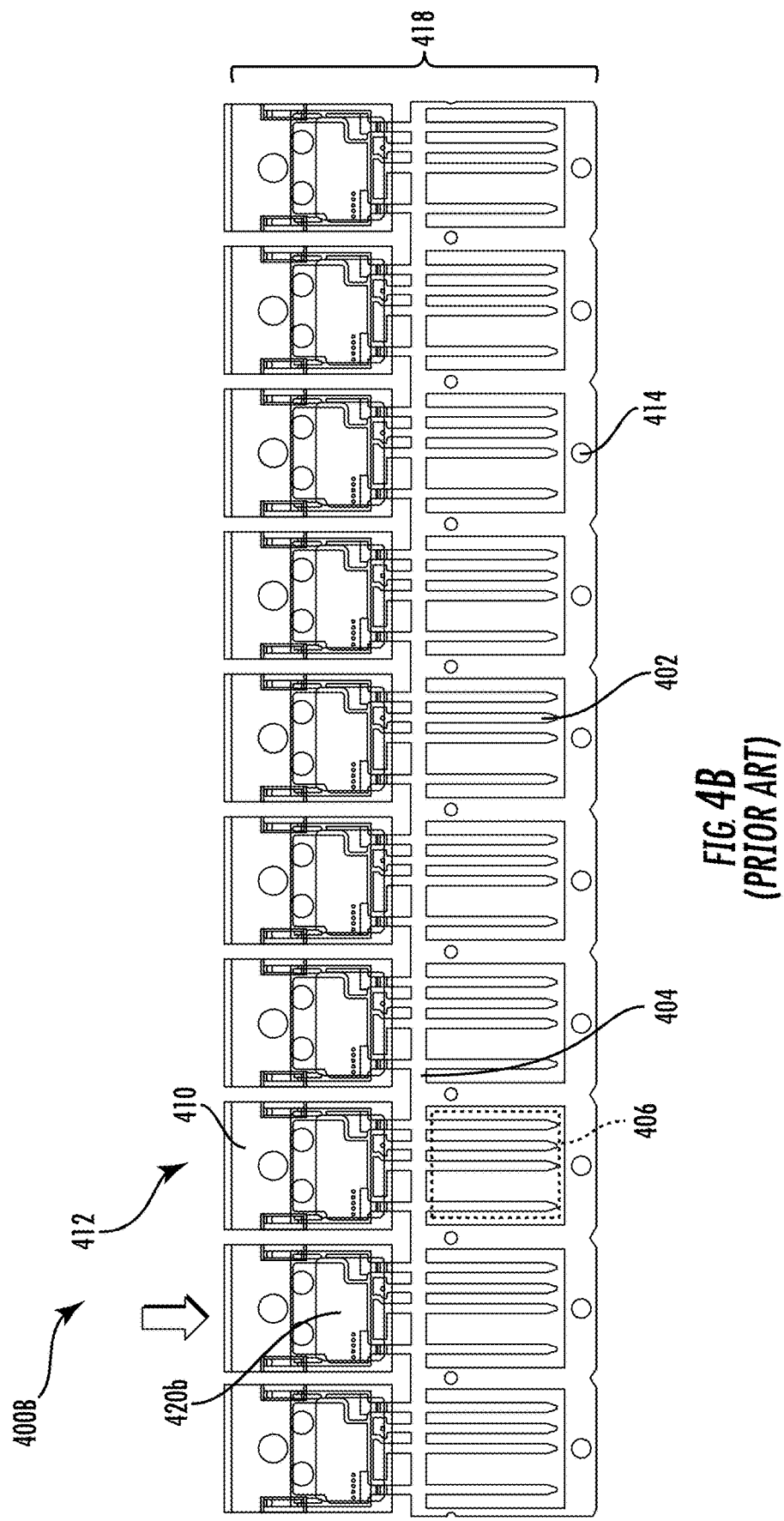
Figure 4C:
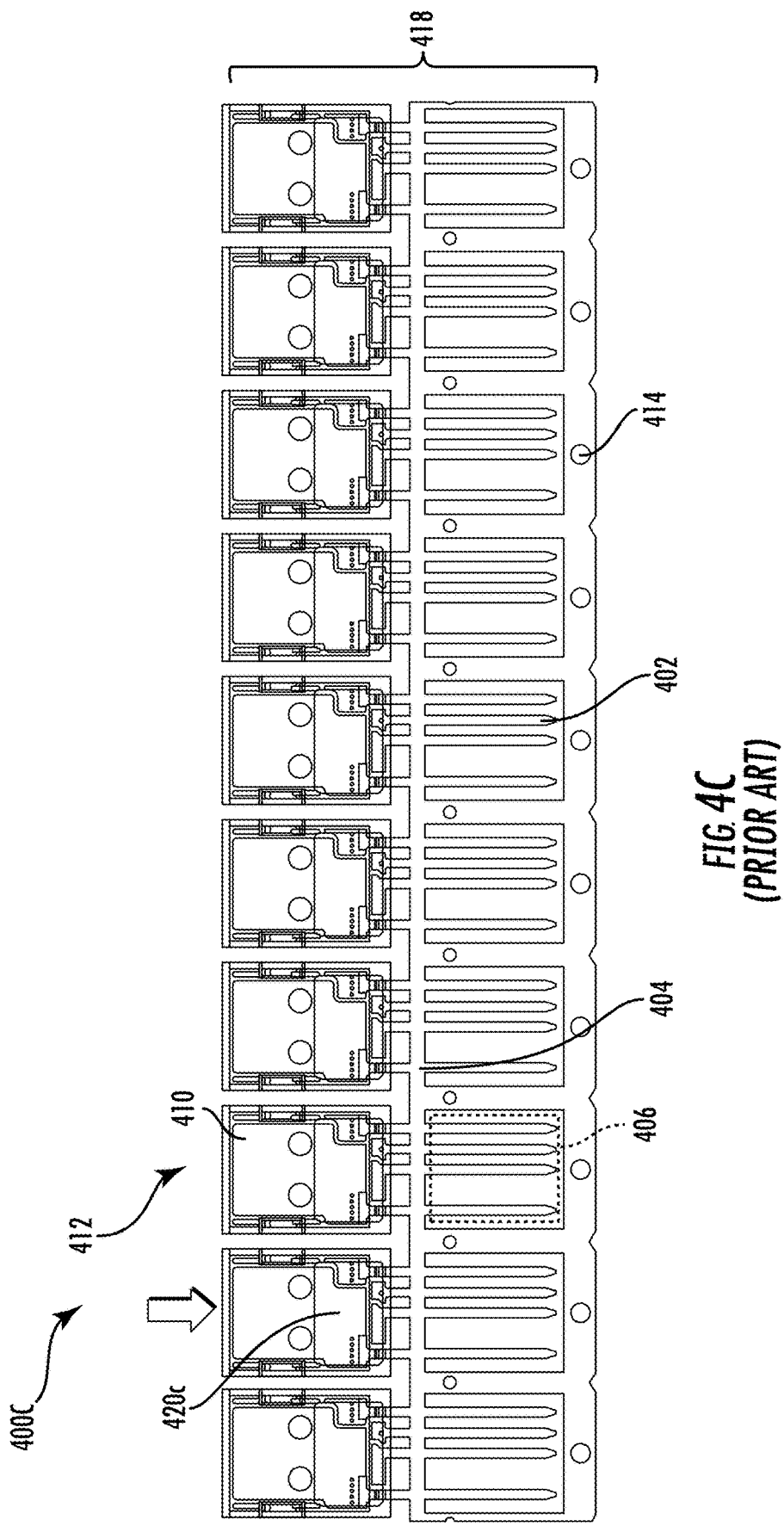

FIGS. 4A-4C are representative drawings of leadframe assemblies 400A, 400B, and 400C (collectively, "leadframe assembly 400" or "leadframe assemblies 400"), according to the prior art. Leadframe assembly 400A shown is a Molded Outline of Non-Isolated PSPs with mounting hole (FIG. 4A), leadframe assembly 400B shown is a Molded Outline of Isolated PSPs with mounting hole (FIG. 4B), and leadframe assembly 400C shown is a Molded Outline of Isolated PSPs without mounting hole (FIG. 4C). The leadframe assembly 400 may, for example, be used to assembly the legacy PSP 100 described herein.

For each PSP 412, the leadframe assemblies 400 feature a leadframe 418, which extends the length of the PSP. The leadframe assemblies 400 also include a DAP 420a (FIG. 4A) which is being replaced by DCB 420b (FIG. 4B) and also being replaced by DCB 420c (FIG. 4C), (FIG. 4B), the leads 402, and a dambar 404. The dambar 404 (see also FIG. 1F) helps prevent leakage of the encapsulant, such as EMC, from bleeding into the leads 402. A region 406 is shown where the dambar 404 prevents the encapsulant 410 from bleeding into the leads 402. Each leadframe assembly 400 also features location holes 414 for fixing the assembly to a machine during the molding process.

As illustrated in FIGS. 2A-2F and 3A-3D, the novel PSPs 200 do not utilize legacy leadframes. Thus, there is no dambar for preventing bleeding of the encapsulant onto the leads. A novel process for manufacturing the PSP 200 is thus introduced herein. Nevertheless, in exemplary embodiments, some of the legacy processing steps are utilized.

Figure 5:
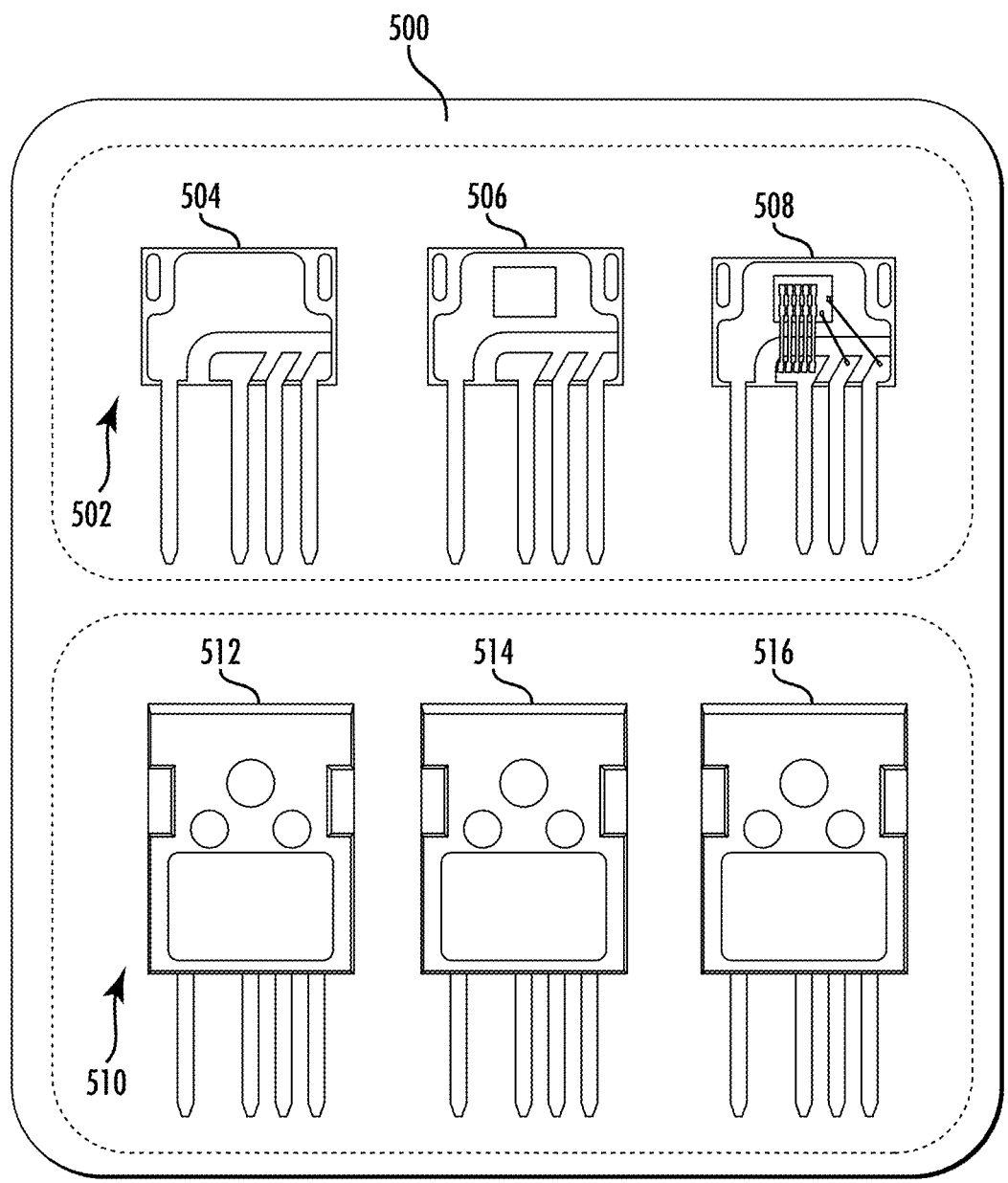
FIG. 5 is a diagram illustrating assembly steps for the power semiconductor package of FIGS. 2A-2F, in accordance with exemplary embodiments.

FIG. 5 is a representative drawing of assembly steps 500 for creating a PSP without a leadframe, such as the PSP 200, according to exemplary embodiments. The assembly steps 500 include two sub-assembly categories, a legacy assembly process 502, in which front-of-line assembly process steps mirror that of legacy PSP manufacture, and a novel assembly process 510, in which new process steps described herein are employed in the PSP manufacture.

The legacy assembly process 502 includes substrate on top of a boat/carrier plus die aligner assembly 504, die attach (DA) assembly 506, and wire bonding (WB) assembly 508. These process steps 504, 506, and 508 will be familiar to those of ordinary skill in manufacturing legacy power semiconductor devices, such as legacy TO247 PSPs with leadframes.

The novel assembly process 510 includes a novel transfer molding assembly 512, barrel tin (Sn) plating or electroless plating 514, and final testing 516, where final testing also includes an option to utilize a skew tool assembly for lead conditioning at the final test station or an offline tool to correct bent leads, which may be particularly useful for PSPs with longer leads. In exemplary embodiments, the transfer molding assembly 512 is described herein in detail and utilizes a non-dambar transfer molding by a pinch bar technique.

Figure 6E:
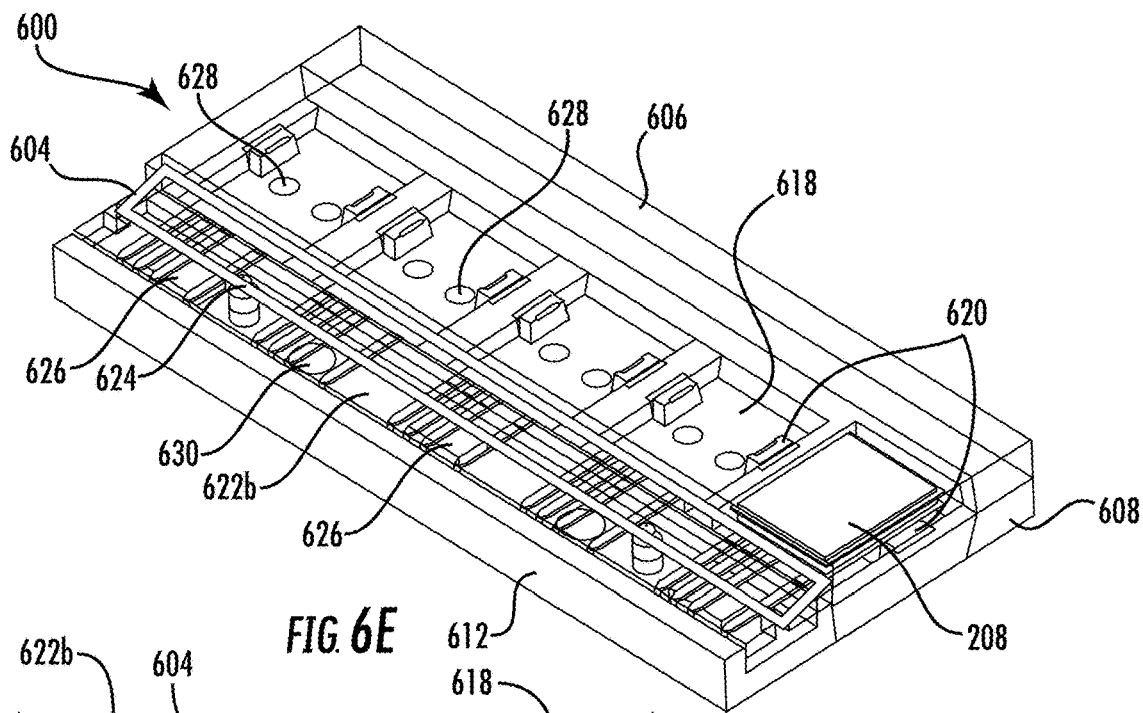
Figure 6F:
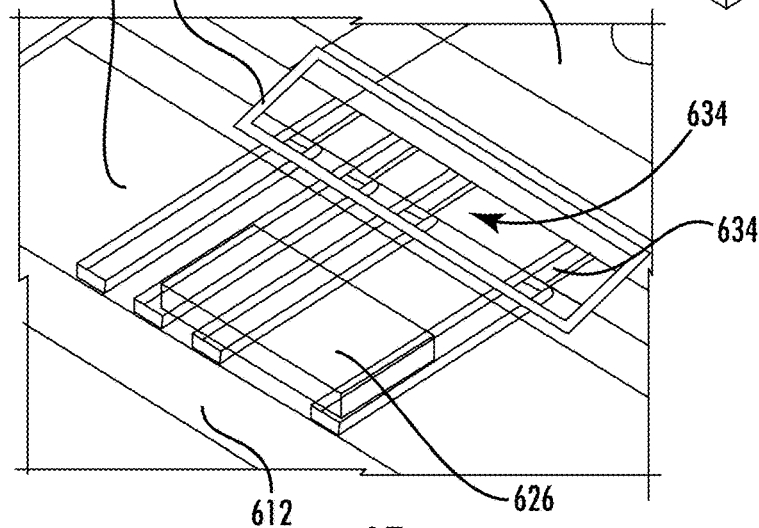
Figure 6G:
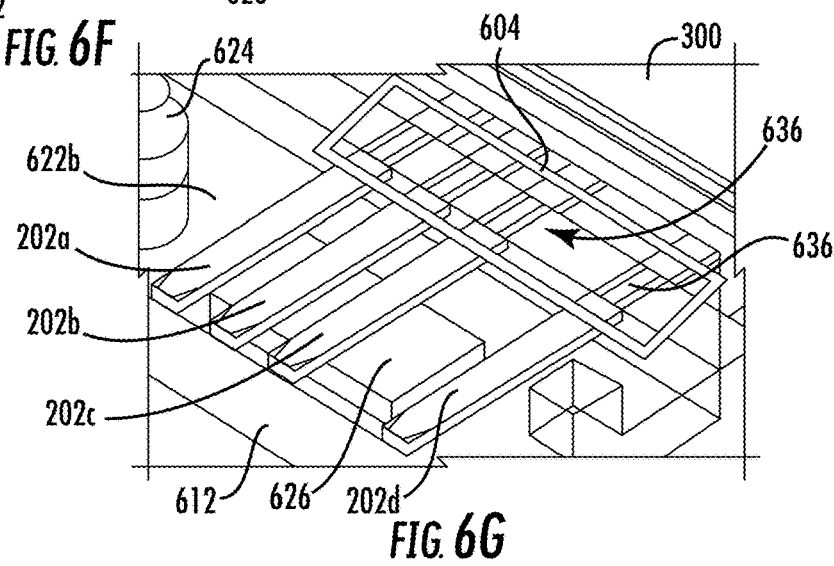

FIGS. 6A-6G are representative drawings of tools used to perform transfer molding assembly 512 for creating PSPs 200, according to exemplary embodiments. FIG. 6A is an isometric view of a transfer mold 600 populated with substrate assemblies 300, FIG. 6B is a side view of the transfer mold 600, FIG. 6C is an isometric view of the PSP 200, FIG. 6D is a detailed view of a pinchbar that is part of the transfer mold 600, FIG. 6E is a second isometric view of the transfer mold 600 populated with a single substrate assembly 300, FIG. 6F is a detailed isometric view of a bottom leadguide block with a PSP, and FIG. 6G is a detailed isometric view of the bottom leadguide block without a PSP. Following the description of these tools, a detailed treatment of the transfer molding process is described in conjunction with FIGS. 8A-8M, below. In several drawings, the substrate assembly 300 is shown upside-down from the illustrations of FIGS. 3A and 3C, with the bottom copper layer of the substrate 208 being visible.

In FIGS. 6A, 6B, and 6E, a transfer mold 600 is shown. In exemplary embodiments, the transfer mold features a pinchbar 602 that prevents bleeding of an encapsulant, such as epoxy molding compound, as the components of the PSP are surrounded by the encapsulant. Pinchbar locations 604 are shown as circles in FIGS. 6A and 6B, and as rectangles in FIGS. 6E-6G. The pinchbar locations 604 are adjacent the substrates 208 (see FIG. 6C) close to where the leads 202 mate with the substrates. In exemplary embodiments, the encapsulant 210 is to surround the AMB substrate 208 of the substrate assembly 300 and the part of the leads 202 that mate with the substrate, as illustrated in FIG. 6C. The encapsulant 210, however, is not to cover the part of the leads extending outside from the AMB substrate 208, except for a portion of the leads 202 that connect to the AMB substrate 208. In exemplary embodiments, this region is where the pinchbar locations 604. Put another way, the pinchbar locations 604 are disposed where the dambar would be if the leads were part of a leadframe.

Looking particularly at FIG. 6B, the substrate assembly 300 is shown inside the transfer mold 600. The transfer mold 600 includes a top gate block 606 and a bottom gate block 608 directly below the top gate block. The top gate block 606 and bottom gate block 608 are located on the side of the substrate assembly 300 that is most distant from the leads 202. The transfer mold 600 further includes a top leadguide block 610 and a bottom leadguide block 612, with a mating portion 612a to mate with the top leadguide block 610. The top leadguide block 610 and the mating portion 612a of the bottom leadguide block 612 are where the pinchbar 602 is located (see also FIG. 6D).

The transfer mold 600 also includes a top cavity 616 and a bottom cavity 618. In exemplary embodiments, encapsulant 210 will enter the transfer mold 600 at the top gate entry 632, which is between the top gate block 606 and bottom gate block 608, such that the encapsulant 210 is deposited into the cavity formed by the top cavity 616 and bottom cavity 618. Encapsulant 210 is shown in FIG. 6B surrounding the substrate assembly 300, but still more encapsulant, not visible in the side view, may occupy the top cavity 616 and the bottom cavity 618, such that the encapsulant surrounds the substrate portion of the substrate assembly 300, including above the substrate portion.

A top carrier plate 622a and a bottom carrier plate 622b (collectively, "carrier plate(s) 622") surround the leads 202 of the substrate assembly 300. The carrier plates 622a and 622b each consist of magnetic blocks 626 which, disposed on opposite sides of the leads 202, hold the leads 202 in place. FIGS. 6A and 6E-6G show the magnetic blocks 626 in the bottom carrier plate 622b. The top carrier plate 622a similarly includes magnetic blocks (not shown) so that the leads 202 are clamped on either side. Although magnetic blocks 626 are shown for every other unit, in some embodiments, the carrier plates 622 may instead have magnetic blocks 626 for every substrate assembly 300.

In exemplary embodiments, the top leadguide block, the top cavity 616, and the top gate block are planar to one another and form a top chase (or cover) 638 of the transfer mold 618, and the bottom gate block 608 are planar to one another and form a bottom chase (or base) (640) of the transfer mold 600 (FIG. 6B). The bottom leadguide block 612 has its own cavity inside which the carrier plate 622 will fit. In describing the transfer molding process (FIGS. 8A-8M), it will become apparent how these elements of the transfer mold 600 are utilized.

Location pins 624 for receiving the carrier plates 622 are also part of the transfer mold 624, in exemplary embodiments. Two location pins 624 are shown for every five substrate assemblies 300, that is, a first location pin 624 between disposed between first and second substrate assemblies and a second location pin 624 being disposed between fourth and fifth substrate assemblies. In some embodiments, the number of location pins 624 may be adjusted according to the number of substrate assemblies 300 per transfer mold 600 or based on other factors.

As illustrated in FIG. 6E, the transfer mold 600 further includes one or more ejector pins 628 and 630, the former being disposed beneath the bodies of the substrate assemblies 300 and the latter being beneath the bottom carrier plate 622b. In exemplary embodiments, the ejector pins 628 and 630 facilitate removal of the substrate assemblies 300 and carrier plates during the transfer molding process, as well as the PSPs 200 following completion of the transfer molding operations. As with the location pins and magnetic blocks 626, the number of ejector pins 628 and 630 may be modified from what is illustrated.

In exemplary embodiments, the transfer mold 600, and more specifically, the top leadguide block 610 and the bottom leadguide block 612, feature pinchbar protrusions 614 and pinch bar crevices 634, respectively, to mate with one another when the top chase 638 is mated with the bottom chase 640 of the transfer mold 600, with the leads 202 being disposed therebetween. Pinchbar protrusions 614 are shown in FIG. 6D while pinchbar crevices 634 are shown in FIG. 6F, with the two pinchbar protrusions 614 and pinchbar crevices 634 known generally herein as pinchbars 602. Recall that the pinchbars 602 are in the pinchbar locations 604 as noted in several of the illustrations. Deformations 636 of the leads 202 illustrated in FIG. 6G where the pinchbars 602 have depressed against both sides of the leads. In exemplary embodiments, the pinchbars 602 (e.g., pinchbar protrusions 614 and pinchbar crevices 634) prevent bleeding of the encapsulant, such as epoxy molding compound, during manufacture of the PSPs 200.

Further, in exemplary embodiments, the transfer mold 600 features support bars 620 to provide structural support to each of the substrate assemblies 300. In exemplary embodiments, each cavity of the transfer mold 600 supporting a substrate assembly 300 includes two support bars 620, one on either side of the AMB substrate 208 of the substrate assembly. Support bars 620 are shown in FIGS. 6A-6B and 6E. The function of the support bars 620 is further described in conjunction with the illustration in FIG. 7.

Figure 7:
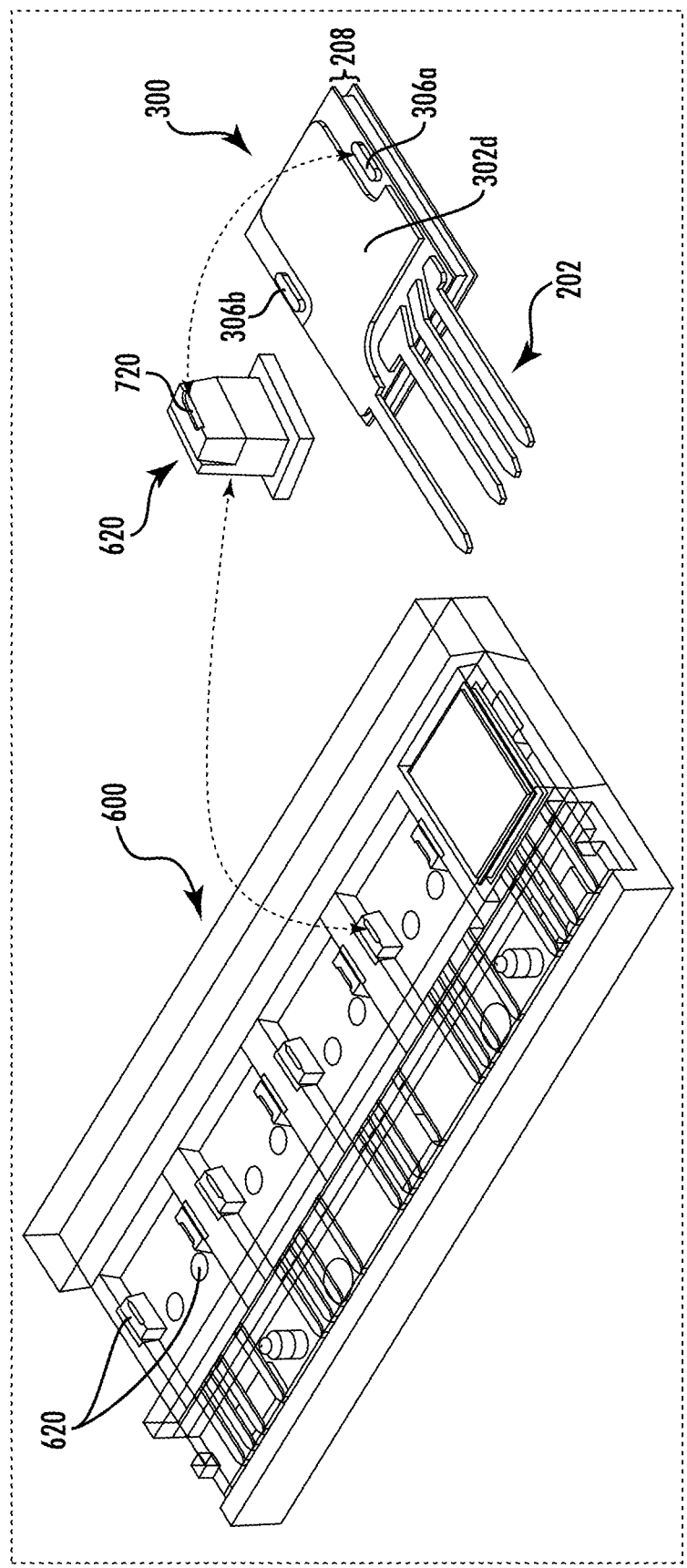
FIG. 7 is a detailed diagram illustrating the support bar portion of the transfer molding assembly of FIGS. 6A-6B, in accordance with exemplary embodiments.
Figure 8A:
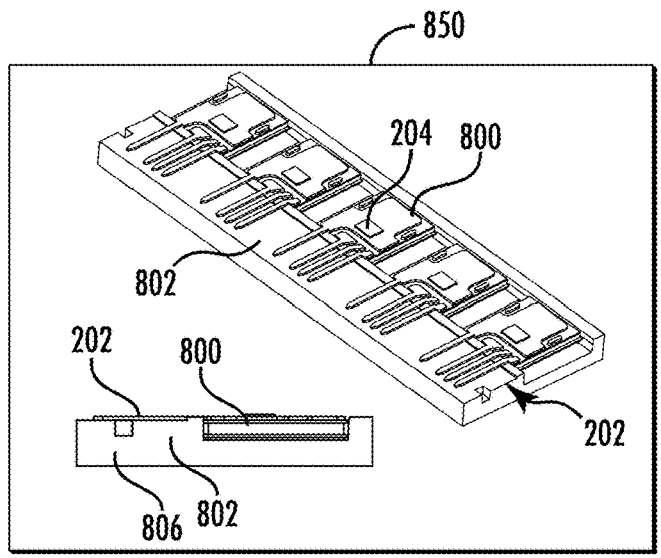
FIGS. 8A-8M are detailed diagrams illustrating the transfer molding operations used to create the power semiconductor package of FIGS. 2A-2F, in accordance with exemplary embodiments.
Figure 8B:
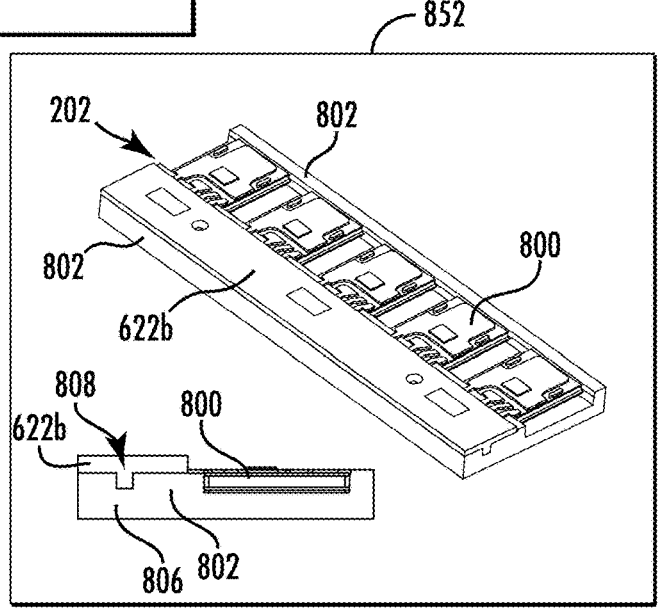
Figure 8C:
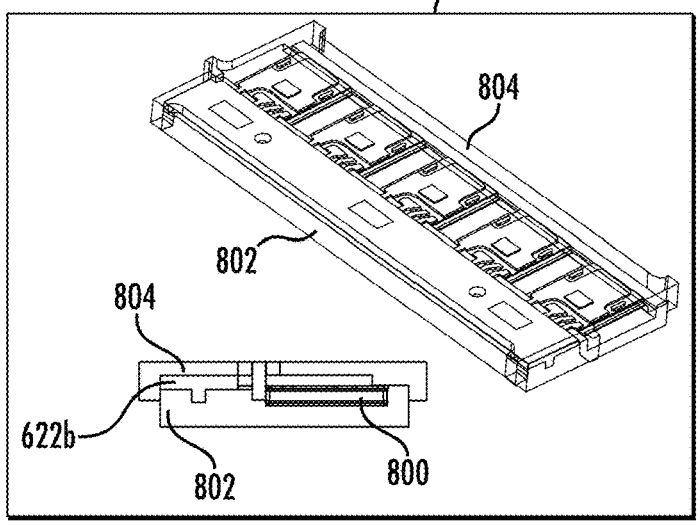
Figure 8D:
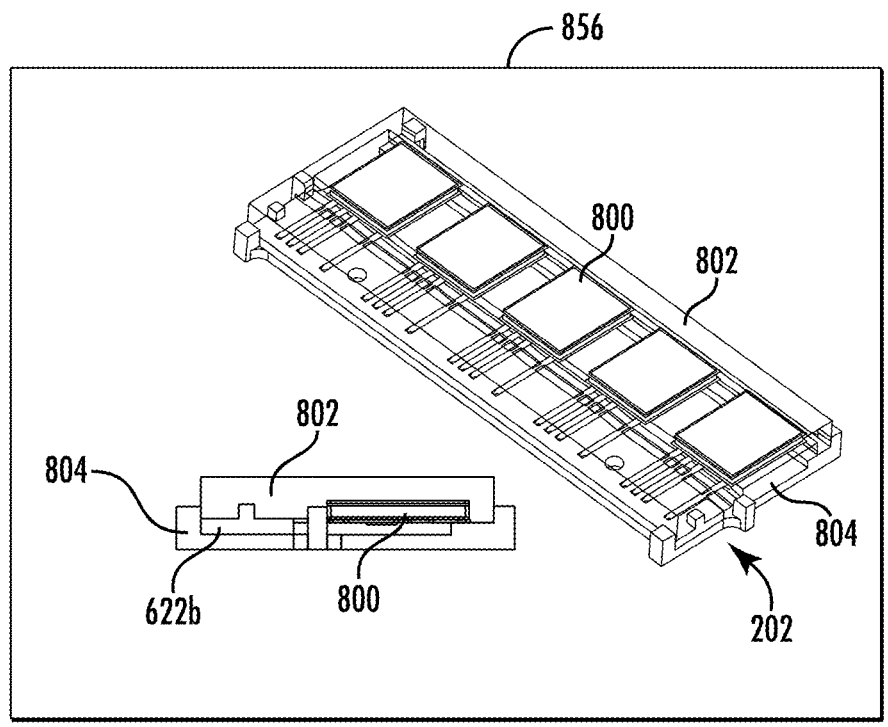
Figure 8E:
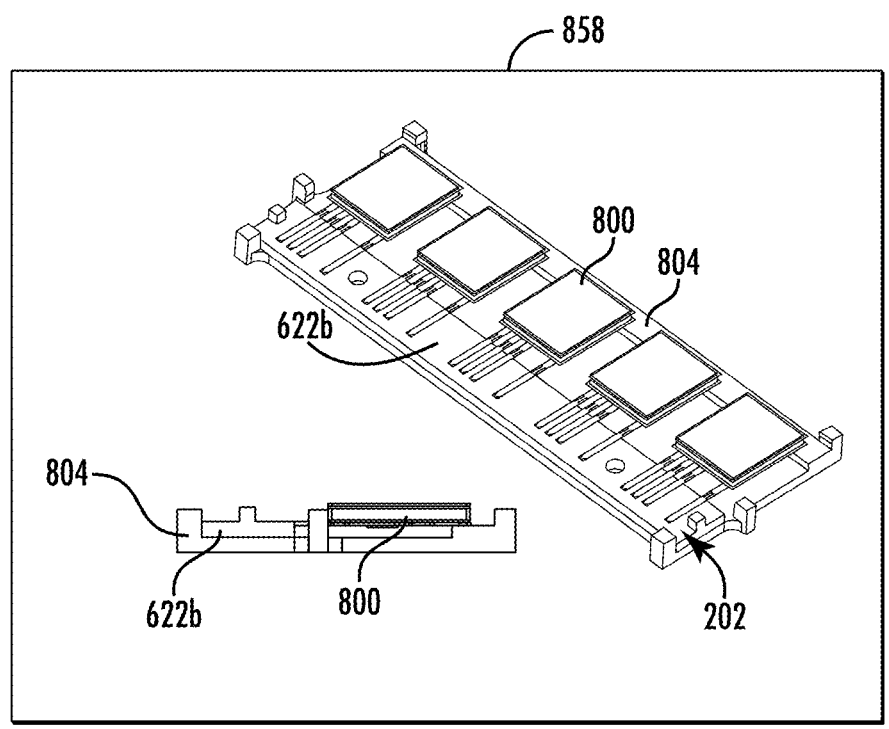
Figure 8F:
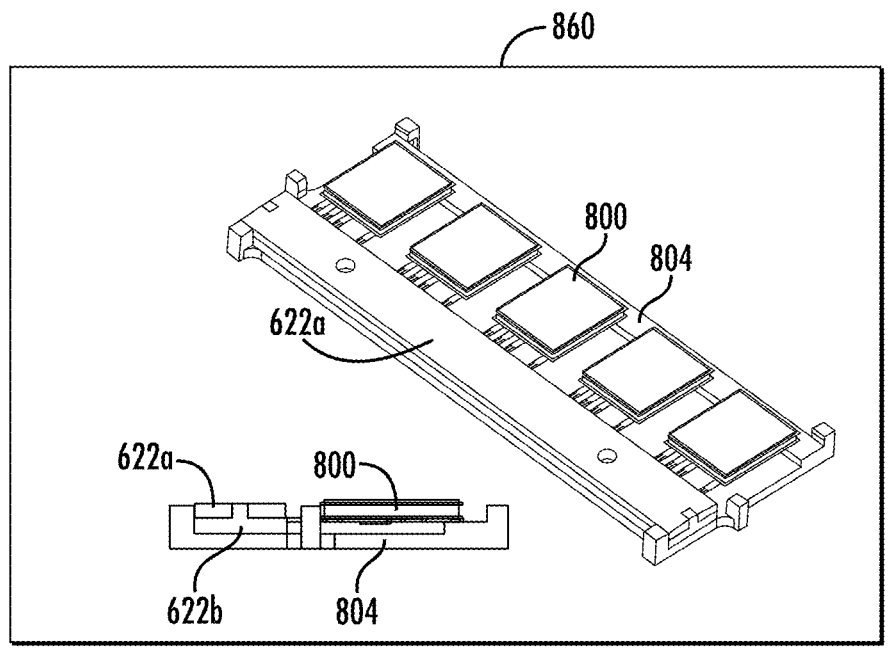
Figure 8G:
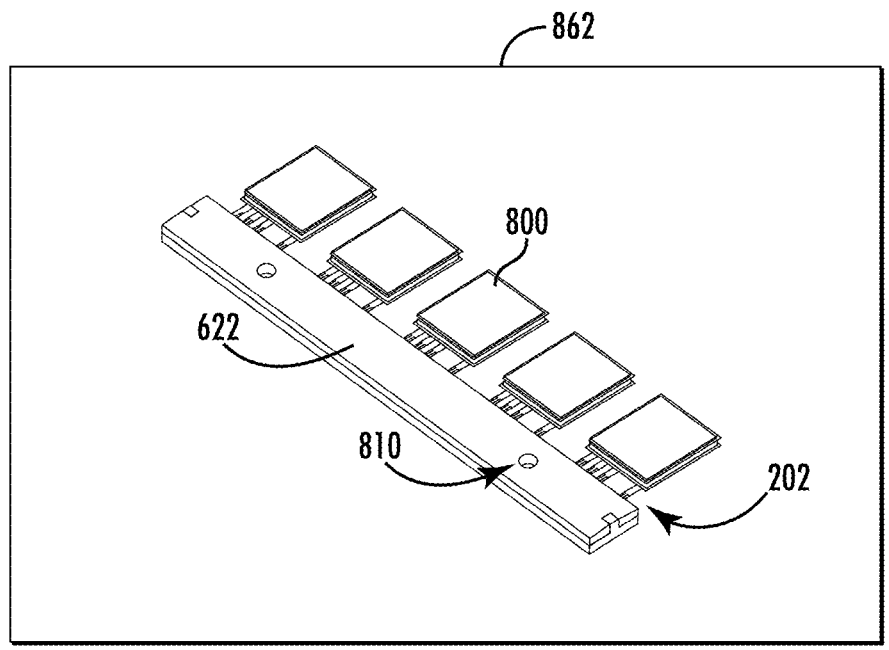
Figure 8H:
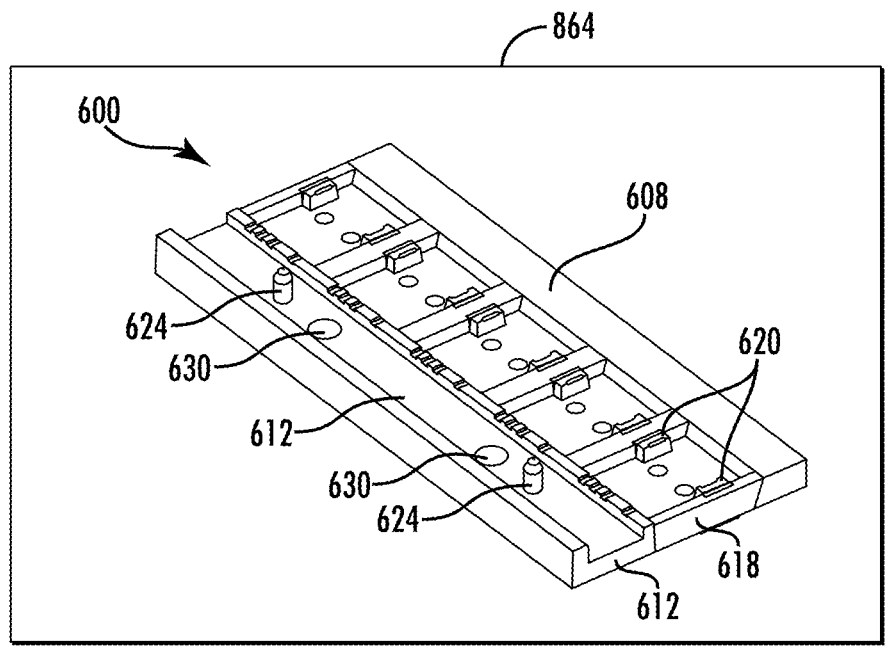
Figure 8I:
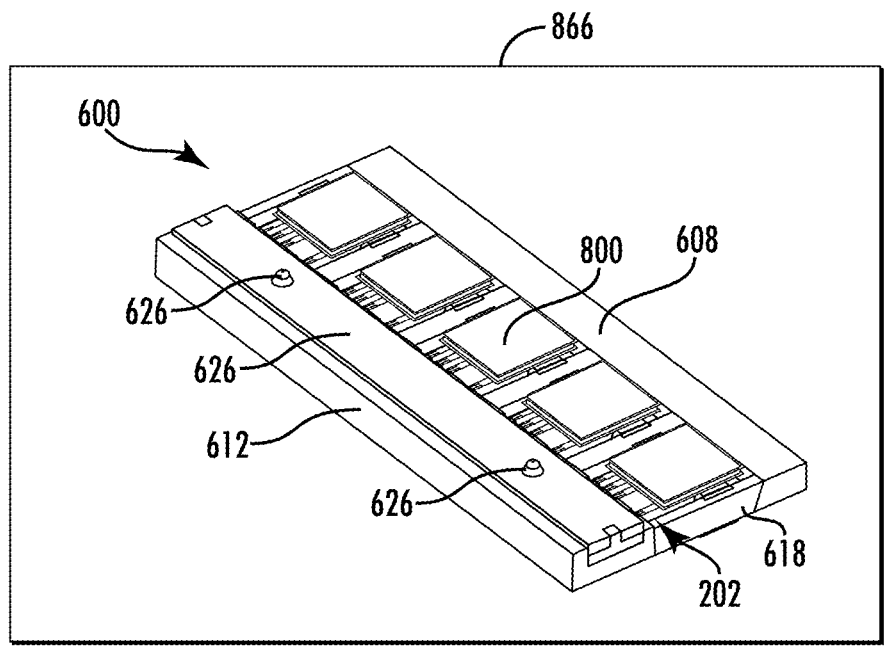
Figure 8J:
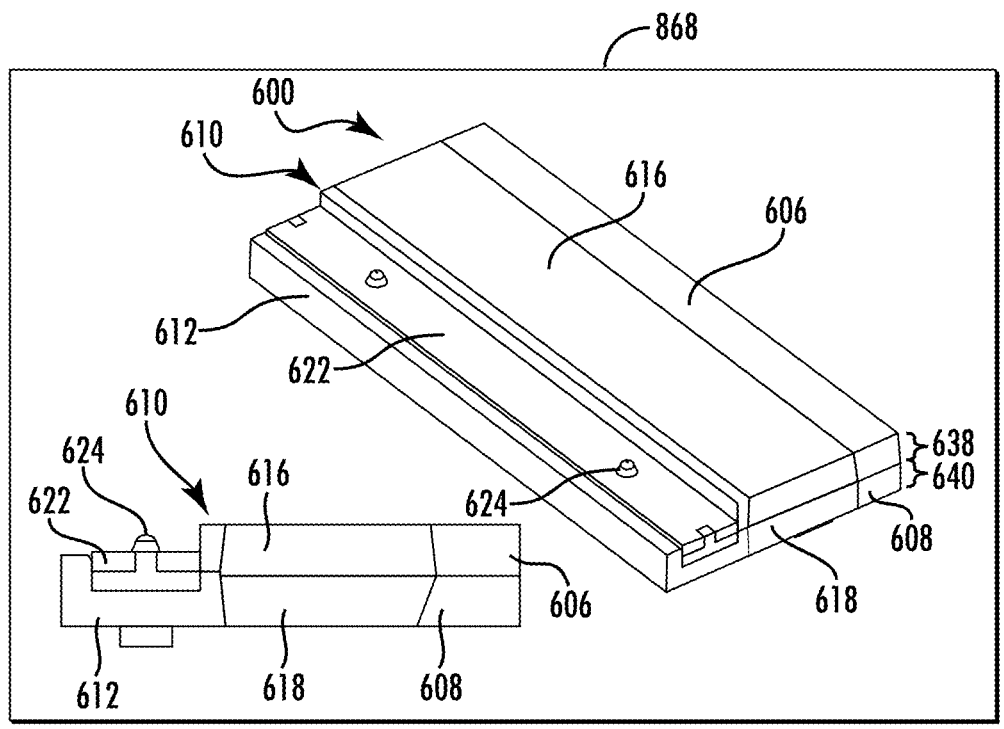
Figure 8K:
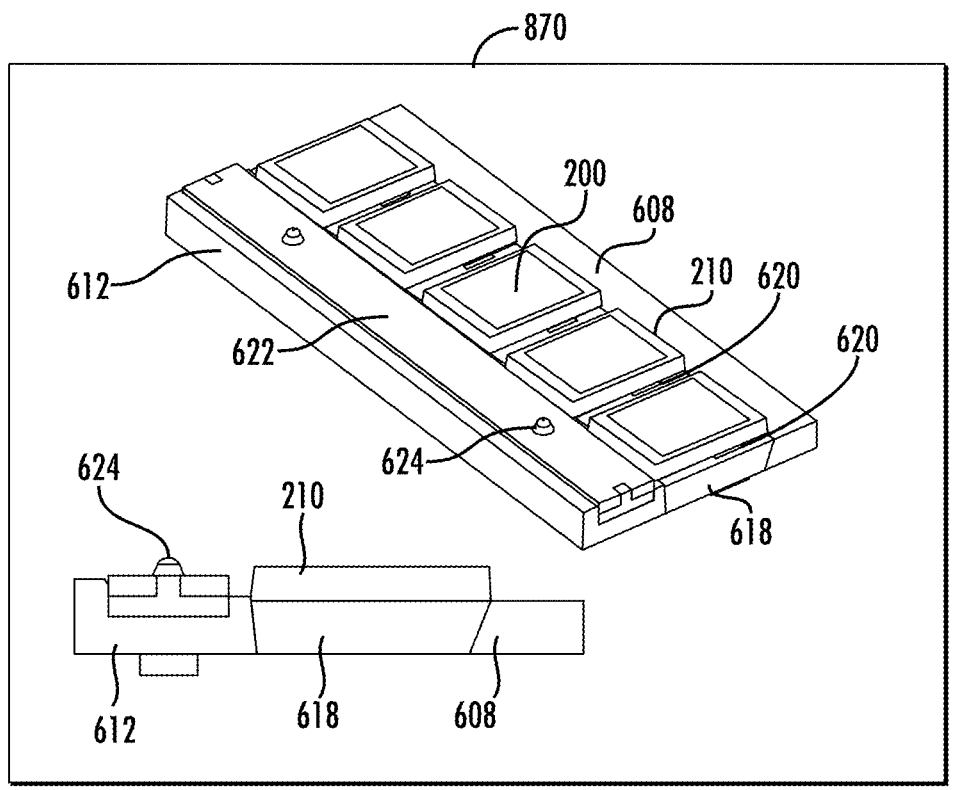
Figure 8L:
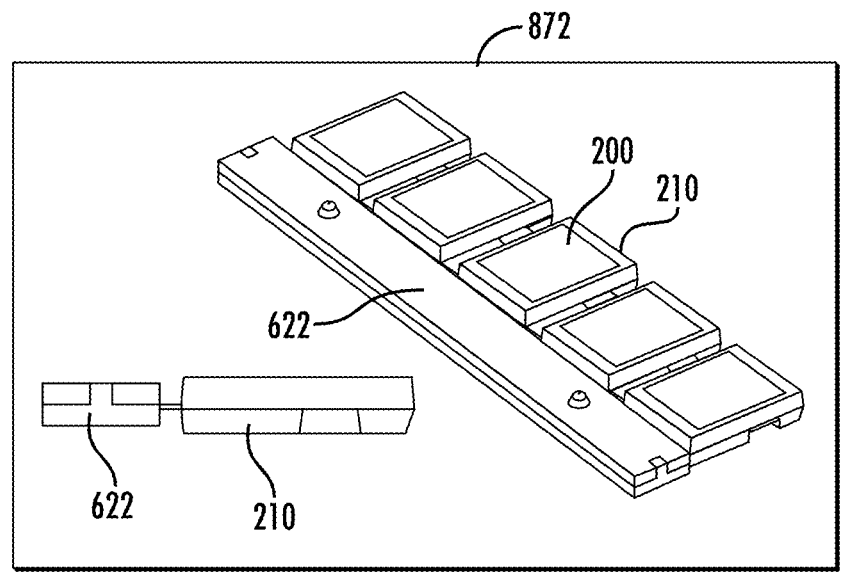
Figure 8M:
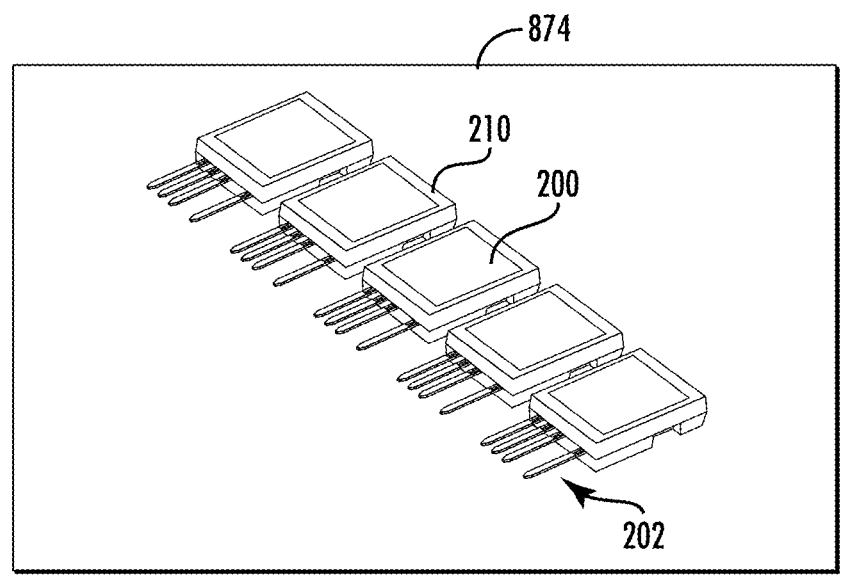

FIG. 7 is a representative drawing of the support bar 620 that is part of the transfer mold 600, according to exemplary embodiments. FIG. 7 shows the transfer mold 600, the support bar 620, and the substrate assembly 300 that form part of the PSP 200. Recall that the substrate assembly 300 features copper islands 306 disposed on either side of lead extension 302d. In exemplary embodiments, the support bar 620 features an indentation 702 that is shaped like the copper island 306. When the substrate assembly 300 is flipped over onto the transfer mold 600, each copper island 306 will fit onto an indentation 702 of respective support bars 620.

In exemplary embodiments, the support bars 620 disposed on either side of the substrate assembly 300 provide alignment of the substrate assemblies 300 inside the transfer mold 600. Simultaneously, the carrier plates 622 provide alignment of the leads 202 of the substrate assembly 300, in exemplary embodiments.

FIGS. 8A-8M are representative drawings showing the manufacturing operations used to manufacture PSPs 200 with the transfer mold 600, according to exemplary embodiments. FIGS. 8A-8M provide detailed isometric, and in some cases, side views, of the tools used to perform steps 850-874 of the transfer mold process. The units shown in the transfer mold process steps are a modified substrate assembly 800 (hereinafter, "substrate assembly 800" or "substrate assemblies 800"), which includes the substrate assembly 300 with the die 204 added to the lead extension 302d (see, e.g., substrate assembly 300 in FIG. 7).

In step 850 (FIG. 8A), the substrate assemblies 800, following reflow and wire bonding (WB), are placed in an aluminum boat 802. In exemplary embodiments, the aluminum boat 802 is depressed in a first plane on one side for receiving the substrate portion of the substrate assemblies 800 and elevated in a second plane for receiving the leads 202 of the substrate assembly.

In step 852 (FIG. 8B), a magnetic lead aligner with embedded magnets, also known as carrier plate 622b (FIG. 6B) is inserted into the aluminum boat 802 to be disposed over the leads 202 of the substrate assembly 800. In exemplary embodiments, the aluminum boat 802 and the carrier plate 622b are keyed with one another. In some embodiments, the aluminum boat 802 has a groove 806 for receiving a ledge 808 of the carrier plate 622b. Designers of ordinary skill in the art recognize a number of different implementations for keying the aluminum boat 802 and the carrier plate 622b so that they fit together. In the side view of FIG. 8B, the carrier plate 622b is mated with the aluminum boat 802 by fitting the ledge 808 into the groove 806. In exemplary embodiments, the magnetic blocks 626 embedded in the carrier plate 622b cause the carrier plate (along with magnetic blocks 626 disposed in carrier plate 622a) to be affixed to the leads 202 of the substrate assembly 800.

In step 854 (FIG. 8C), an aluminum jig 804 is added to the top of the aluminum boat 802 and carrier plate 622b assembly. In exemplary embodiments, at this stage, the aluminum jig 804 provides a cover over the substrate assemblies 800. In step 856 (FIG. 8D), the assembly including the aluminum jig 804 is inverted with the substrate assemblies 800 inside. Once inverted, the aluminum jig 804 is now beneath the substrate assemblies 800, with the carrier plate 622b also being disposed beneath the leads 202 of the substrate assemblies. By contrast, the aluminum boat 802 is now disposed above the substrate assemblies 800. In step 858 (FIG. 8E), the aluminum boat 802 is removed from the top of the substrate assemblies 800.

In step 860 (FIG. 8F), the carrier plate 622a is inserted over the carrier plate 622b, forming a complete carrier plate surrounding the leads 202. In exemplary embodiments, the carrier plate 622a also includes magnetic blocks 626, to surround the leads 202 and hold the substrate assemblies 800 in place. In some embodiments, the carrier plate 622a also includes a groove, like the groove 806 in the aluminum boat 802, so that the protrusion 808 of the carrier plate 622b fit into the groove of the carrier plate 622a.

In step 862 (FIG. 8G), the substrate assemblies 800 are removed from the aluminum jig 804. Because of the magnets in the carrier plates 622, the substrate assemblies 800 are stable and remain unmoved. In step 864 (FIG. 8H), the transfer mold 600 introduced above is retrieved.

In step 866 (FIG. 8I), the substrate assemblies 800 with the carrier plates 622 are inserted into a bottom chase 640 of the transfer mold 600. In exemplary embodiments, the bottom chase 640 features the bottom leadguide block 612, the bottom cavity 618, and the bottom gate block 608, where the bottom cavity 618 houses the substrate portion of the substrate assemblies 800 and the mating portion 612a of the bottom leadguide block 612 includes the pinchbar crevices 634 (see FIGS. 6B and 6F). The bottom leadguide block 612 also features the location pins 624. In exemplary embodiments, the carrier plates 622 feature pin holes 810 for fitting over the location pins 624 of the bottom leadguide block 612.

In step 868 (FIG. 8J), a top chase 638 of the transfer mold 600 is placed over the substrate assemblies 800 to enclose them. In exemplary embodiments, the top chase 638 consists of the top gate block 606, the top cavity 616, and the top leadguide block 610 (FIG. 6B), where the top leadguide block 610 also features the pinchbar protrusions 614 (FIG. 6D). The substrate assemblies 800 are now enclosed inside the transfer mold 600. At this stage, the encapsulant 210, such as epoxy molding compound, is injected at the location between the top gate block 606 and the bottom gate block 608 of the transfer mold 600 (top gate entry 632 in FIG. 6B).

In step 870 (FIG. 8K), once the epoxy molding compound is dried, the top chase 638 of the transfer mold 600 is opened, revealing the completed PSPs 200. In exemplary embodiments, the pinchbar 602 of the top leadguide block 610 and bottom leadguide block 612 has prevented the epoxy molding compound from bleeding into the leads 202 of the PSPs 200.

In step 872 (FIG. 8L), the carrier plate 622 is removed from the bottom chase 640 of the transfer mold 600. In exemplary embodiments, ejector pins 630 at the carrier plate 622 and ejector pins 628 beneath the PSPs 200 facilitate the removal from the transfer mold 600. The PSPs 200 are now ready for degate and decull operations. In step 874 (FIG. 8M), the PSPs 200 are removed from the carrier plate 622. The manufacturing assembly of the PSPs 200, using the transfer mold 600 with the pinchbar feature, is thus complete.

Figure 9A:
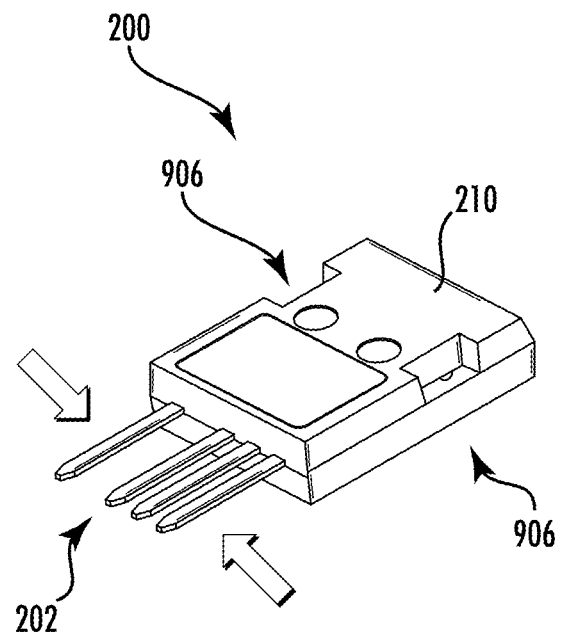
FIGS. 9A-9C are detailed diagrams illustrating skew tools for lead conditioning of the power semiconductor package of FIGS. 2A-2F, in accordance with exemplary embodiments.
Figure 9B:
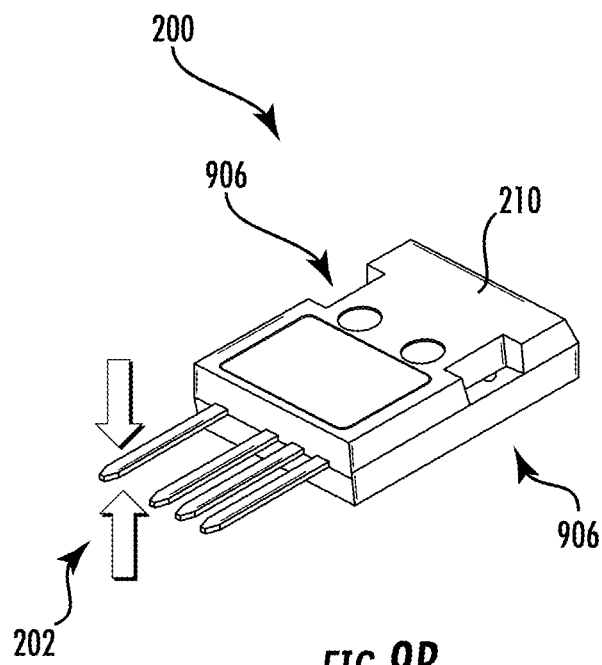
Figure 9C:
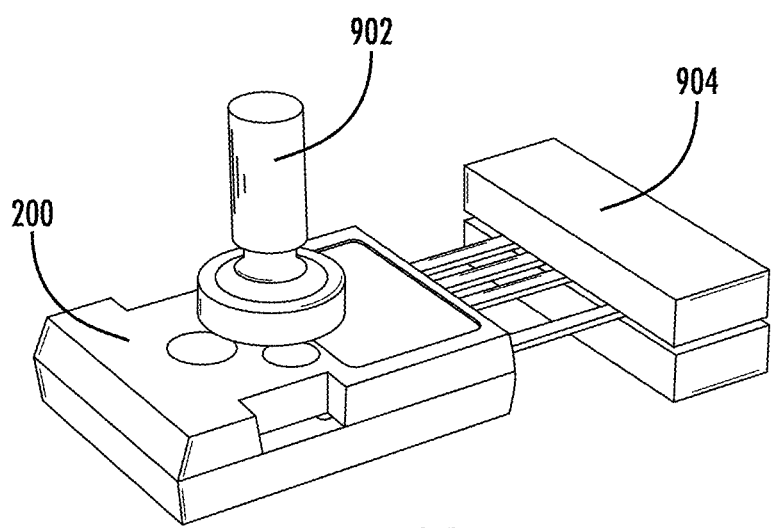

FIGS. 9A-9C are representative drawings of skew tools for lead conditioning of the PSP 200, according to exemplary embodiments. FIGS. 9A-9B are isometric illustrations of the PSP 200, and FIG. 9C is a photographic illustration of the tools used for lead conditioning. The PSP 200 is shown in FIGS. 9A-9B, including the leads 202 and the encapsulant 210 covering the AMB substrate and die of the PSP. Indentations 906 are shown on either side of the encapsulant 210, which are due to the present of the support bar 620 in the transfer mold 600 (see, e.g., FIG. 8H). In exemplary embodiments, where they may have been bent during the manufacturing process, the leads 202 of the PSP 200 may be clamped and moved sideways in the X-axis (as indicated by the arrows in FIG. 9A) or moved up and down in the Z axis (as indicated by the arrows in FIG. 9B). In exemplary embodiments, as shown in FIG. 9C, a pick-up tool 902 and a movable clamp 904 may be utilized for purposes of moving the leads 202, as needed, to correct their positions relative to one another or relative to the encapsulant 210.

Further, in some embodiments, a visual inspection of the PSP 200 may be made to check for bent leads.

Figure 10D:
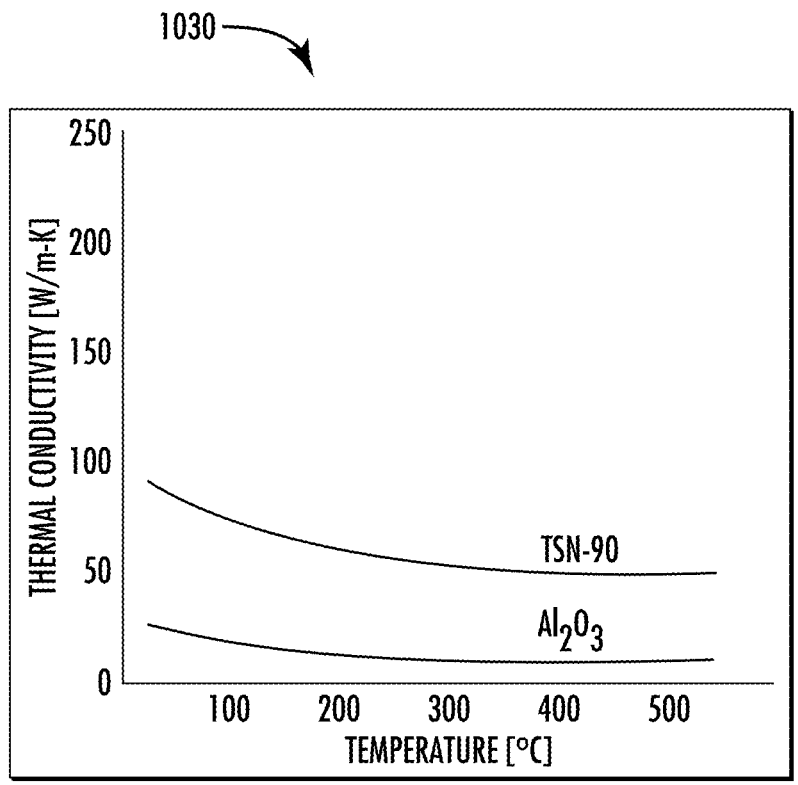
Figure 10E:
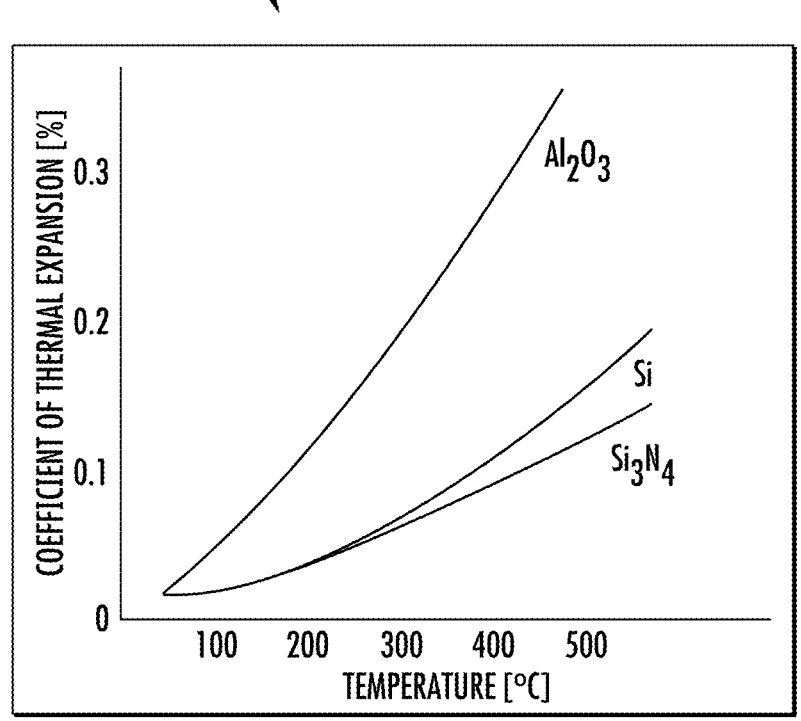

FIGS. 10A-10E are representative drawings providing empirical data in support of using the AMB-based substrate of the PSP 200 over the direct copper bonding (DCB) substrate used in the PSP 100, according to exemplary embodiments. FIGS. 10A-10C are tables 1000, 1010, and 1020, respectively. FIGS. 10D and 10E are graphs 1030 and 1040, respectively showing the superiority of silicon nitride-based substrates over other prior art substrates.

Table 1000 shows advantages of the PSP 200 over the prior art PSP 100. The modifications include use of non-leadframe leads, a high-performance silicon nitride-based active metal brazed substrate, no solder connection between die and substrate or between substrate and leads, minimal warpage of the substrate (due to the thick middle layer of copper), and Ag sintered die. In exemplary embodiments, the benefits include a reduced manufacturing and packaging costs because no leadframe is used; a high current carrying capability, no ceramic crack issue due to high bending strength and toughness, better wirebondability due to smaller grain structure of the silicon nitride structure of the AMB substrate; higher reliability performance due to the absence of solder, better thermal performance (lower RthJc) because of the minimal substrate warpage due to the thick middle copper layer, higher operating temperature, and lead-free, solder void-free, and higher reliability performance by using an Ag sintered die.

Table 1010 compares the use of silicon nitride (sixth column) for the AMB substrate versus the legacy substrates: aluminum oxide-based DCB (second column), aluminum nitride-based DCB/AMB (third column), hybrid aluminum nitride-based DCB/AMB (fourth column), and aluminum oxide-based DCB (fifth column). The properties of flexural strength, thermal conductivity, and coefficient of thermal expansion are compared. Although some of the legacy substrates (aluminum nitride and hybrid aluminum nitride based DCB/AMB) show higher thermal conductivity, those benefits are offset by having lower flexural strength, which means the legacy substrates are more likely to crack. The coefficient of thermal expansion of the silicon nitride is significantly lower than the legacy substrates, where a lower number is better. The microstructure images in the last row of table 1010 shows that the silicon nitride has a much smaller, more uniform microstructure, making it possible to use smaller aluminum wires for connecting to the substrate, such as 5 mil or 3 mil wires, in some embodiments.

Table 1020 compares thermal conductivity, bending strength, and fracture toughness between aluminum oxide (96%), aluminum nitride, aluminum oxide, and silicon nitride. Although exhibiting slightly lower bending strength than aluminum oxide, the silicon nitride exhibits significantly higher thermal conductivity than the other materials and has significantly higher fracture toughness. The silicon nitride thus makes a viable choice for substrate material.

Graph 1030 compares the thermal conductivity versus temperature for TSN-90 (silicon nitride ceramic) and aluminum oxide ceramic. The silicon nitride ceramic has significantly higher thermal conductivity over the range of temperatures shown.

Graph 1040 compares the coefficient of thermal expansion versus temperature for aluminum oxide, silicon, and silicon nitride. The silicon nitride has a lower coefficient of thermal expansion than the silicon or aluminum oxide over the range of temperatures shown.

The power semiconductor package 200 is thus an improvement over the legacy PSP 100 in several respects. The leadframe material and the soldering to the substrate are eliminated, for a reduction in both cost and manufacturing process steps. The trim/singulation process of legacy leadframe-based PSP manufacture is eliminated because there is no longer a need to undergo the trimming of the dambar to form the plurality of leads, known as singulation. In some embodiments, the lack of solder connection from the leadframe to substrate improves system reliability. Ag sintering can be used instead of soldering, resulting in a totally lead-free semiconductor package. The PSP 200 can manage more current carrying capability than the existing DCB-based packages due to the thicker copper pattern thickness on top of the substrate (e.g., 0.4-0.8 mm), in exemplary embodiments. The thicker middle copper layer (e.g., 1.5 mm) results in over package warpage control improvement, resulting in better thermal performance (lower Rth) over legacy products. The features of the PSP 200 can be maximized to SiC benefits from packaging technology, and quicker product prototyping can be achieved due to the absence of a leadframe, in exemplary embodiments.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure refers to certain embodiments, numerous modifications, alterations, and changes to the described embodiments are possible without departing from the sphere and scope of the present disclosure, as defined in the appended claim(s). Accordingly, it is intended that the present disclosure is not limited to the described embodiments, but that it has the full scope defined by the language of the following claims, and equivalents thereof.

The invention claimed is:

1. A power semiconductor package (PSP) comprising:
   a substrate comprising alternating layers of copper and silicon nitride;
   a plurality of copper leads coupled to the substrate using active metal brazing, wherein the copper leads are not part of a leadframe; and
   a die coupled to the substrate using silver sintered paste;
   an encapsulant to encase the substrate and the die, wherein a portion of the plurality of copper leads are external to the encapsulant;
   a first copper layer having a first dimension;
   a second copper layer having a second dimension;
   a first ceramic layer sandwiched between the first copper layer and the second copper layer, the first ceramic layer having a third dimension;
   a third copper layer having the first dimension; and
   a second ceramic layer sandwiched between the second copper layer and the third copper layer, the second ceramic layer having the third dimension.

2. The PSP of claim 1, wherein the first ceramic layer and the second ceramic layer comprise silicon nitride.

3. The PSP of claim 1, wherein the second dimension is greater than the first dimension.

4. The PSP of claim 1, wherein the second dimension is 1.5 mm.

5. The PSP of claim 1, wherein the first dimension is between 0.4 mm and 0.8 mm.

6. The PSP of claim 1, wherein the third dimension is 0.25 mm.

7. A transfer mold for use in manufacture of a power semiconductor package (PSP), the transfer mold comprising:
- a top leadguide block and a bottom leadguide block, the top and bottom leadguide blocks to surround a plurality of leads of a substrate assembly of the PSP, wherein the substrate assembly comprises the plurality of leads that are not part of a leadframe, a substrate, and a die;
- a top cavity and a bottom cavity, the top and bottom cavities being adjacent the top leadguide block and the bottom leadguide block, respectively, wherein the substrate of the substrate assembly fits into the top and bottom cavities;
- wherein a pinchbar disposed between the top leadguide block and the bottom leadguide block prevents bleeding of an encapsulant deposited into a cavity formed by mating the top cavity with the bottom cavity;
- a top gate block and a bottom gate block, the top and bottom gate block being adjacent the top and bottom cavities, respectively, wherein an encapsulant is deposited into the top and bottom cavities between the top gate block and the bottom gate block, wherein:
- the top leadguide block, the top cavity, and the top gate block are planar to one another and form a top chase; and the bottom leadguide block, the bottom cavity, and the bottom gate block are planar to one another and form a bottom chase.

8. The transfer mold of claim 7, further comprising:
- a top carrier plate comprising a first plurality of magnets, the top carrier plate to be disposed over the plurality of leads; and
- a bottom carrier plate comprising a second plurality of magnets, the bottom carrier plate to be disposed under the plurality of leads, wherein the top carrier plate and the bottom carrier plate fit into the bottom leadguide block.

9. The transfer mold of claim 7, the pinchbar further comprising:
- a pinchbar protrusion disposed at a base portion of the top leadguide block; and
- a pinchbar crevice disposed at a top portion of the bottom leadguide block;

wherein the pinchbar protrusion mates with the pinchbar crevice when the top chase is mated with the bottom chase.

10. The transfer mold of claim 7, further comprising a support bar having an indentation upon which is seated a copper island of the substrate assembly.

11. The transfer mold of claim 10, wherein the support bar prevents movement of the substrate assembly inside the transfer mold.

12. A method for manufacturing a power semiconductor package using a transfer mold, the method comprising:
- inserting a plurality of substrate assemblies into an aluminum boat, each of the plurality of substrate assemblies comprising leads, a substrate, and a die, wherein the aluminum boat is:
  - depressed in a first plane on a first side, the depression to form a cavity for receiving substrates of the plurality of substrate assemblies; and
  - elevated in a second plane on a second side, the second side being adjacent to the first, the second side for receiving leads of the plurality of substrate assemblies;
- adding a carrier plate to the aluminum boat, the carrier plate being disposed over the leads of the plurality of substrate assemblies;
- fitting the substrate assemblies into a bottom chase of a transfer mold, the bottom chase comprising a bottom leadguide block including one or more pinchbar crevices;
- covering the carrier plate and the aluminum boat with an aluminum jig; and
- inverting the carrier plate, the aluminum boat, and the aluminum jig so that the aluminum jig is disposed beneath and the aluminum boat is disposed atop the plurality of substrate assemblies.

13. The method of claim 12, further comprising:
- removing the aluminum boat from the plurality of substrate assemblies; and
- adding a second carrier plate over the carrier plate, the carrier plate and the second carrier plate each comprising one or more magnets to affix the second carrier plate to the first carrier plate, wherein the carrier plate and the second carrier plate are keyed to fit together.

14. The method of claim 13, further comprising:
- holding the affixed carrier plates, removing the substrate assemblies from the aluminum jig; and
- the bottom leadguide block of the bottom chase to hold the carrier plates, the bottom chase further comprising:
  - a bottom cavity for holding substrates of the plurality of substrate assemblies; and
  - at least one location pin, wherein the carrier plates further comprise at least one pin hole for fitting over the location pin.

15. The method of claim 14, further comprising:
- attaching a top chase of the transfer mold to the bottom chase, the top chase comprising:
  - a top leadguide block including one or more pinchbar protrusions that mate with the pinchbar crevices; and
  - a top cavity for holding the substrates, the top cavity and the bottom cavity, when mated, forming an enclosed cavity for receiving an encapsulant; and
- injecting the encapsulant into the enclosed cavity, the encapsulant to surround the substrates.

16. The method of claim 15, further comprising:
- once the encapsulant has dried, removing the top chase from the transfer mold;
- removing the carrier plate from the bottom chase of the transfer mold; and
- removing the top carrier plate and the bottom carrier plate from the leads.

* * * * *